(12) United States Patent
Fujita

(10) Patent No.: US 8,790,792 B2
(45) Date of Patent: *Jul. 29, 2014

(54) ORGANIC ELECTROLUMINESCENT DEVICE

(75) Inventor: Tetsuji Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1100 days.

This patent is subject to a terminal disclaimer.

(21) Appl. No.: 12/051,417

(22) Filed: Mar. 19, 2008

(65) Prior Publication Data

US 2008/0241592 A1  Oct. 2, 2008

(30) Foreign Application Priority Data

Mar. 27, 2007  (JP) .................. 2007-080886

(51) Int. Cl.
  *H01L 51/50* (2006.01)
  *C09K 11/00* (2006.01)

(52) U.S. Cl.
  USPC ............ 428/690; 428/917; 313/504; 313/506

(58) Field of Classification Search
  None
  See application file for complete search history.

(56) References Cited

U.S. PATENT DOCUMENTS

| | | | |
|---|---|---|---|
| 4,769,292 A | 9/1988 | Tang et al. | |
| 5,281,489 A * | 1/1994 | Mori et al. | 428/690 |
| 6,268,072 B1 * | 7/2001 | Zheng et al. | 428/690 |
| 6,309,763 B1 | 10/2001 | Woo et al. | |
| 6,617,051 B1 | 9/2003 | Higashi et al. | |
| 6,815,090 B1 | 11/2004 | Tagami et al. | |
| 6,899,963 B1 * | 5/2005 | Zheng et al. | 428/690 |
| 7,235,312 B2 | 6/2007 | Iwakuma et al. | |
| 7,282,275 B2 * | 10/2007 | Wolk et al. | 428/690 |
| 7,727,641 B2 * | 6/2010 | Fujita | 428/690 |
| 7,727,642 B2 * | 6/2010 | Fujita | 428/690 |
| 2003/0091862 A1 | 5/2003 | Tokito et al. | |
| 2004/0048100 A1 * | 3/2004 | Ebisawa et al. | 428/690 |
| 2004/0135131 A1 | 7/2004 | Treacher et al. | |
| 2005/0129979 A1 * | 6/2005 | Kambe et al. | 428/690 |
| 2005/0186443 A1 * | 8/2005 | Marrocco et al. | 428/690 |
| 2005/0249972 A1 | 11/2005 | Hatwar et al. | |
| 2006/0040136 A1 * | 2/2006 | Liu et al. | 428/690 |
| 2006/0058494 A1 * | 3/2006 | Busing et al. | 528/86 |
| 2006/0149022 A1 * | 7/2006 | Parham et al. | 528/102 |
| 2006/0199943 A1 * | 9/2006 | Falcou et al. | 528/422 |
| 2006/0238110 A1 * | 10/2006 | Shirai et al. | 313/503 |
| 2008/0090102 A1 * | 4/2008 | Fujita | 428/704 |

FOREIGN PATENT DOCUMENTS

| | | |
|---|---|---|
| EP | 1 298 117 A2 | 4/2003 |
| JP | A-63-264692 | 11/1988 |
| JP | A-06-033048 | 2/1994 |

(Continued)

OTHER PUBLICATIONS

"Vinyl Polymers." Polymer Science Learning Center, Department of Polymer Science, The University of Southern Mississippi, 2005. Web. Dec. 16, 2011.*

(Continued)

*Primary Examiner* — Dawn Garrett
(74) *Attorney, Agent, or Firm* — Oliff PLC

(57) ABSTRACT

An organic electroluminescent device includes a light-emitting layer containing at least one host material and at least one luminescent dopant serving as a guest. The host material is a polymer having repeating units linked to each other by non-conjugated bonds and the luminescent dopant is a Π-conjugated oligomer.

13 Claims, 15 Drawing Sheets

(56) References Cited

FOREIGN PATENT DOCUMENTS

| | | |
|---|---|---|
| JP | A-06-073374 | 3/1994 |
| JP | A-2000-026334 | 1/2000 |
| JP | A-2000-026337 | 1/2000 |
| JP | A-2000-268963 | 9/2000 |
| JP | A-2000-268964 | 9/2000 |
| JP | A-2000-323276 | 11/2000 |
| JP | A-2000-344691 | 12/2000 |
| JP | A-2001-196179 | 7/2001 |
| JP | A-2002-008867 | 1/2002 |
| JP | B2-3290432 | 6/2002 |
| JP | A-2002-536492 | 10/2002 |
| JP | A-2003-026616 | 1/2003 |
| JP | A-2003-040845 | 2/2003 |
| JP | A-2003-104916 | 4/2003 |
| JP | A-2004-002351 | 1/2004 |
| JP | 2004-303483 * | 10/2004 |
| JP | A-2005-053806 | 3/2005 |
| JP | A-2005-108720 | 4/2005 |
| JP | A-2005-166680 | 6/2005 |
| JP | A-2005-216683 | 8/2005 |
| JP | A-2005-281210 | 10/2005 |
| JP | A-2005-285466 | 10/2005 |
| JP | A-2006-213725 | 8/2006 |
| WO | WO 98/30071 A | 7/1998 |
| WO | WO 00/41443 A | 7/2000 |
| WO | WO 00/46321 A | 8/2000 |
| WO | WO 02/077060 A1 | 10/2002 |
| WO | WO 2005/059951 A2 | 6/2005 |

OTHER PUBLICATIONS

Marsitzky et al., "End-Functionalization of Poly(2,7-fluorene): A Key Step toward Novel Luminescent Rod-Coil Block Copolymers," *Macromolecules*, vol. 32, pp. 8685-8688, 1999.

Mitchell et al., "Straining strained molecules. III. The spectral and mutagenic properties and an alternate synthesis of Diaceperylene and dicyclopenta [1,2,3-*cd*: 1', 2', 3'-*lm*] perylene," *Canadien Journal of Chemistry*, vol. 70, pp. 1015-1021, 1992.

Li et al., "Synthesis and electroluminescence properties of fluorene containing arylamine oligomer," *Polymers for Advanced Technologies*, vol. 15, pp. 266-269, 2004.

Oida et al, "A New Synthesis of 1,3-Diarylisobenzofurans," *Synthesis*, vol. 2, pp. 131-133, Feb. 1980.

Jaffe et al., "Interaction of Perpendicular π-Electron Systems," *Journal of American Chemical Society*, vol. 85, No. 11, pp. 1561-1564, Jun. 5, 1963.

Debad et al., "Anodic Coupling of Diphenylbenzo[k]fluoranthene: Mechanistic and Kinetic Studies Utilizing Cyclic Voltammetry and Electrogenerated Chemiluminescence," *Journal of Organic Chemistry*, vol. 62, No. 3, pp. 530-537, 1997.

Hreha et al., "2-7-Bis (diarylamino)-9,9-dimethylfluorenes as Hole-Transport Materials for Organic Light-Emitting Diodes," Advanced Functional Materials, 2003, 13, No. 12, December, pp. 967-973.

Edelmann et al., "Dramatically Enhanced Fluorescence of Heteroaromatic Chromophores upon Insertion as Spacers into Oligo(triacetylene)s," Helvetica Chimica Acta, vol. 85, 2002, pp. 2195-2213.

Debad et al, "Dibenzotetraphenylperiflanthene: Synthesis, Photophysical Properties, and Electrogenerated Chemiluminescence," J. Am. Chem. Soc., 1996, 118, pp. 2374-2379.

Saroja et al., "Synthesis of Alkylated Aminofluorenes by Palladium-Catalyzed Substitution at Halofluorenes," Journal of Organic Chemistry, 2004, 69(3), pp. 987-990.

Obrey et al., Aluminum Alkoxides as Synthons for Methylalumoxane (MAO): Product-Catalyzed Thermal Decomposition of [Me$_2$Al(µ-OCPh$_3$)]$_2$, Organometallics 2001, 20(24), pp. 5162-5170.

Mondal et al., "Polycyclic Aromatic Compounds: Part IX—A New Synthesis of Highly Arylated Fluoranthene Derivatives," Indian Journal of Chemistry, Section B, Organic Chemistry Including Medicinal Chemistry, 22B(3), 1983, pp. 225-229.

Lee et al., "Color Tuning in Polyfluorenes by Copolymerization with Low Band Gap Comonomers," Synthetic Metals, vol. 102 (1999), pp. 1087-1088.

* cited by examiner

ORGANIC ELECTROLUMINESCENT DEVICE

BACKGROUND

1. Technical Field

The present invention relates to organic electroluminescent (EL) devices used for displays, light sources, and the like. The present invention particularly relates to organic EL compounds suitable for coating-type organic EL devices and also relates to an organic EL device containing the organic EL compounds.

2. Related Art

In recent years, organic EL devices including organic EL elements have been being developed. The organic EL devices are suitable for light-emitting displays alternative to liquid crystal displays. The following documents disclose the organic EL devices and methods for manufacturing the organic EL devices: JP-A-2000-323276 (hereinafter referred to as Patent Document 1), JP-A-2002-536492 (hereinafter referred to as Patent Document 2), JP-A-6-73374 (hereinafter referred to as Patent Document 3), JP-A-6-33048 (hereinafter referred to as Patent Document 4), JP-A-2005-285466 (hereinafter referred to as Patent Document 5), and Japanese Patent No. 3290432 (hereinafter referred to as Patent Document 6).

A known technique useful in manufacturing a conventional organic EL device is as follows: a host material and a luminescent dopant are used to form a light-emitting layer such that the conventional organic EL device has high light-emitting efficiency and long life and the light emitted from the conventional organic EL device can be varied in color. The technique is widely used for organic EL devices manufactured by the vapor deposition of an organic material but is not commonly used for coating-type organic EL devices manufactured by forming a layer of a polymeric material by an ink jet process (a droplet ejection process) or a spin-coating process.

The meanings and features of the host material and the luminescent dopant are as described below.

(1) The host material is a material that allows both electrons and holes to flow therethrough.

(2) In an organic EL device including a light-emitting layer containing no luminescent dopant but the host material, light is emitted from the host material. However, in an organic EL device including a light-emitting layer containing the luminescent dopant and the host material, light is not emitted from the host material but is emitted from the luminescent dopant.

(3) The spectrum of the light emitted from the organic EL device containing the luminescent dopant and the host material corresponds to that of the fluorescent or phosphorescent light emitted from a luminescent center in the luminescent dopant. The term "luminescent center" herein means a portion of the luminescent dopant or an organic group that can emit strong fluorescent or phosphorescent light. The spectrum of the light emitted from the organic EL device depends on the luminescent center.

Problems listed in Table 1 below are probably reasons why the host material and the luminescent dopant are not used for the coating-type organic EL devices.

(I) The luminescent dopant bleeds (precipitates or segregates) from a coating formed from a solution containing the host material and the luminescent dopant. This is due to a phenomenon that after a solution containing a polymer and a low-molecular-weight substance is applied onto a member and then dried, the low-molecular-weight substance bleeds out of the surface of a coating formed from this solution or segregates in the coating (see Conventional Techniques 1 and 3 in Table 1).

(II) The luminescent dopant has a low ability to trap holes and electrons. This is particularly serious when the host material is a conjugated polymer. Since the holes and the electrons primarily flow through such a conjugated polymer, the luminescent dopant can hardly trap the holes or the electrons (see Conventional Techniques 1 and 2 in Table 1.

(III) The development of materials serving as a luminescent dopant has been delayed. This is because in the field of coating-type organic EL devices, the host material-luminescent dopant system is less effective than depositional materials (low-molecular-weight electroluminescent materials) because of the above two reasons.

TABLE 1

| | Host material | | Luminescent dopant | |
|---|---|---|---|---|
| | Molecular weight | Conjugated or non-conjugated | Molecular weight | Conjugated or non-conjugated |
| Conventional Technique 1 | High | Conjugated | Low | — |
| Conventional Technique 2 | High | Conjugated | High (oligomer) | Conjugated |
| Conventional Technique 3 | High | Non-conjugated | Low | — |
| Present Invention | High | Non-conjugated | High (oligomer) | Conjugated |

SUMMARY

An advantage of an aspect of the invention an organic EL device including a light-emitting layer containing organic EL compounds such as a host material and a luminescent dopant. The organic EL device has high light-emitting efficiency and long half-brightness lifetime.

The inventors have made intensive investigations to solve the above problems and then have obtained findings below. Problem (I) can be solved as follows: a high-molecular-weight luminescent dopant (including oligomers) is used instead of the above luminescent dopant because the high-molecular-weight luminescent dopant does not bleed (precipitate or segregate) during drying.

Problem (II) can be solved as described below.

(A) The following dopant is used instead of the luminescent dopant: a high-performance luminescent dopant which has a molecular weight close to that of the high-molecular-weight luminescent dopant and which contains a functional group that is more capable of trapping holes or electrons than the host material. The high-performance luminescent dopant functions well when the functional group has a hole-trapping function.

(B) The following dopant is used instead of the luminescent dopant: a luminescent dopant in which a luminescent center is linked to a functional group having a hole-trapping function with a Π bond. Since the luminescent center is linked to the functional group, the fact that the functional group traps holes is the same as that the luminescent center directly traps the holes.

(C) The following dopant is used instead of the luminescent dopant: a luminescent dopant that is more readily oxidized than the host material, that is, a luminescent dopant that has an ionization potential (IP) less than that of the host material. Ionization potential is a key to improve hole-trapping properties.

(D) The following material is used instead of the above host material: a host material that is a polymer having repeating units linked to each other by non-conjugated system. This depends on the mechanism of the migration of carriers (electrons or holes) in an organic layer of the organic EL device. The mechanism is classified into two types. One is the transfer of electrons between molecular orbitals higher than the lowest unoccupied molecular orbital (LUMO) of a Π-conjugated molecule. The barrier of the electron transfer is low and therefore the mobility of the electrons is high. The other one is the hopping of the electrons. The barrier of the electron hopping is high and therefore the mobility of the electrons is low. When the host material in the light-emitting layer is a conjugated polymer, the mobility of carriers (electrons or holes) in the conjugated polymer is high; hence, the luminescent dopant in the light-emitting layer cannot readily trap the carriers. However, the mobility of carriers (electrons or holes) in the polymer, which has the repeating units linked by the non-conjugated system, is low; hence, the carriers can be transferred from the polymer to a dopant with high probability.

(E) A host material having a relatively large molecular weight is used instead of the above host material. The use of such a host material probably prevents material crystallization, which leads to the deterioration of the organic EL device, and enhances the heat resistance of the organic EL device.

The inventors have further made investigations on the basis of the above findings and then have obtained findings below.

In a coating-type organic EL device including a light-emitting layer containing a host material and a luminescent dopant, the presence of a small amount of a material having a hole transport function in the light-emitting layer is effective in controlling the number of holes in the light-emitting layer.

The presence of an electron transport/hole-blocking layer between the light-emitting layer and a cathode enhances properties of the light-emitting layer. The electron transport/hole-blocking layer can be formed by vapor deposition using, for example, tris(8-hydroxyquinoline) aluminum (Alq3).

The inventors have further made investigations on the basis of these findings and thus completed the present invention.

A coating-type organic EL device according to an embodiment of the present invention includes a light-emitting layer contains at least one host material and at least one luminescent dopant serving as a guest. The host material is a polymer having repeating units linked to each other by non-conjugated system and the luminescent dopant is a Π-conjugated oligomer.

Preferred examples of the host material include polymers having polyethylene backbones and polyacene groups (including derivatives), such as naphthalene groups, anthracene groups, fluorene groups, pyrene groups, perylene groups, and phenanthrene groups, pendantly attached thereto.

More preferred examples of the host material include polymers having polyethylene backbones and anthracene groups, fluorene groups, pyrene groups, or phenanthrene groups pendantly attached thereto. This is because the host material needs to be resistant to electrical oxidation and reduction and the energy gap between the highest occupied molecular orbital (HOMO) and LUMO of the host material needs to be greater than that of the luminescent dopant in order to supply energy to the luminescent dopant.

The HOMO and the like can be determined with Photoelectron Spectrometer AC-1, available from Riken Keiki Co., Ltd., or the like.

The energy gap between the HOMO and the LUMO can be determined from the absorption spectrum of a thin film made of the host material. In general, the absorption end at the maximum wavelength of the absorption spectrum is used as the energy gap. The vacuum level of the LUMO can be readily determined from the vacuum level of the HOMO and the HOMO-LUMO gap.

Although it is difficult to specify the molecular weight of the host material, the host material preferably has a molecular weight of about 10,000 to 200,000. This is because the host material needs to have sufficient heat resistance (heat stability), a high glass transition point, and low crystallinity (amorphousness) and the luminescent dopant needs to be prevented from segregating in a drying step. In view of properties of the organic EL device, the host material may have a relatively large molecular weight. However, when the host material has an excessively large molecular weight, problems will occur in manufacturing steps. In particular, a solution with a desired host material concentration cannot be used to form a layer by an ink jet process because an excessive increase in the molecular weight of the host material causes an increase in the viscosity of the solution; hence, a layer formed from the solution may have an insufficient thickness.

The host material has, but not limited to, any one of the following formulas:

Formula I

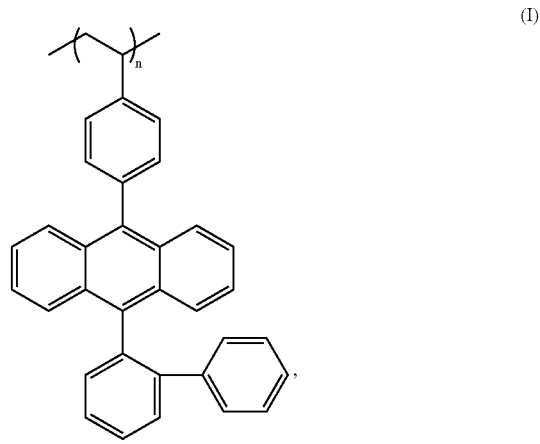

(I)

Formula II

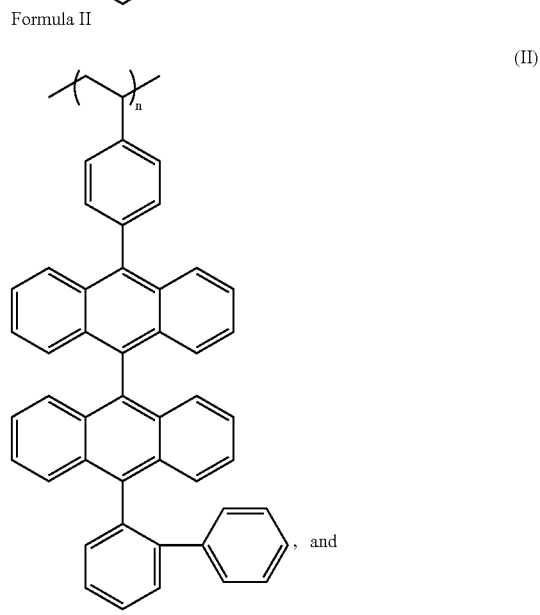

(II)

, and

Formula III

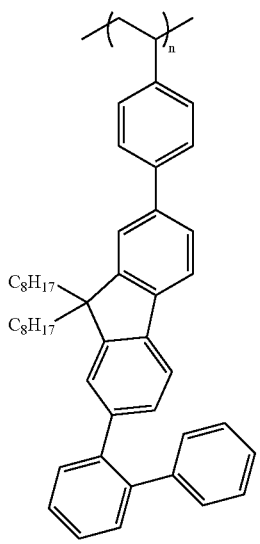

Formula IV

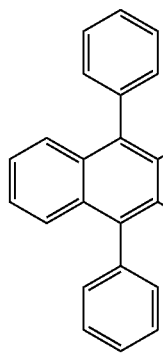

Formula V

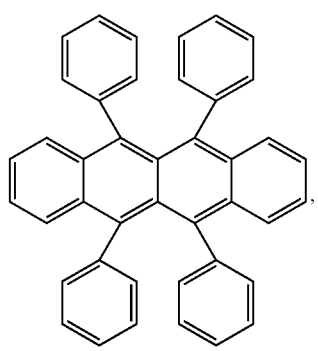

Formula VI

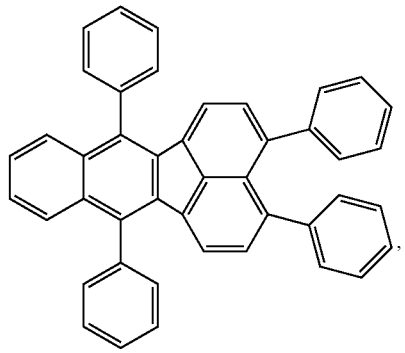

Formula VII

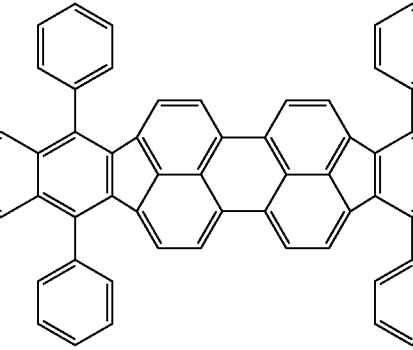

The luminescent dopant is preferably an oligomer containing a luminescent center. The luminescent center is a portion of the luminescent dopant and is herein defined as an organic group capable of emitting strong fluorescent or phosphorescent light. The waveform of the light emitted from the light-emitting device depends on the luminescent center. The luminescent dopant also has a hole-trapping group in addition to the luminescent center. Preferred examples of the hole-trapping group include a triarylamino group and a thiophene group.

Although it is difficult to specify the molecular weight of the luminescent dopant, the lower limit of the luminescent dopant is preferably equal to about one twentieth to one tenth of the molecular weight of the host material. Therefore, the lower limit and upper limit of the luminescent dopant are preferably equal to about 2,000 and 20,000, respectively. This is because the luminescent dopant has the luminescent center and the hole-trapping group, must not bleed, needs to be significantly Π-conjugation, and needs to be soluble in solvents such as toluene, xylene, chlorobenzene, cyclopentanone, and cyclohexanone.

Examples of a material for forming the luminescent center include low-molecular-weight compounds, such as diphenylnaphthacene, tetraphenylnaphthacene, diphenyl benzofluoranthene, tetraphenyldiindenoperylene, perylene, distyrylamine, styryldiamine, distyryldiamine, and derivatives thereof, used for vapor deposition.

The luminescent center-forming material has, but not limited to, any one of the following formulas:

Formula VIII

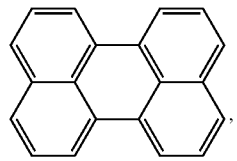
(VIII)

Formula IX

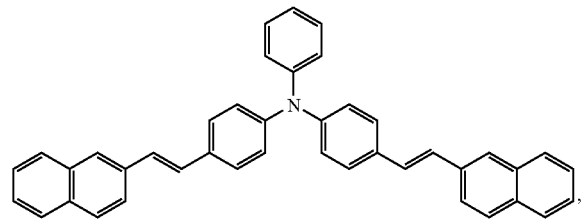
(IX)

Formula X

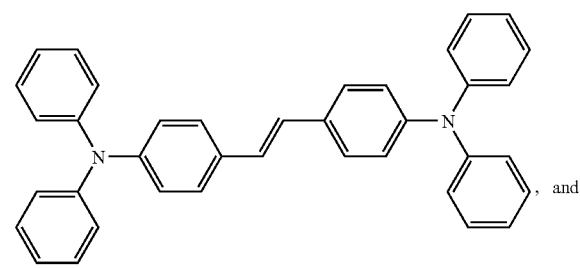
(X), and

Formula XI

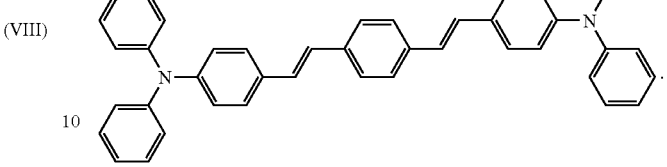
(XI)

The luminescent dopant preferably has a triphenylamine unit, a fluorene unit, and a phenyl group in addition to the luminescent center.

The triphenylamine unit can trap holes flowing through the light-emitting layer and therefore is useful for electroluminescence.

The fluorene unit can trap electrons flowing through the light-emitting layer and therefore is useful for electroluminescence.

The fluorene unit preferably has an alkyl group attached to the 9-position thereof so as to have high solubility and stability. When the alkyl group contains an insufficient number of carbon atoms, the fluorene unit has low solubility. When the alkyl group contains an excessively large number of carbon atoms, the fluorene unit is cracked by heat in a drying step subsequent to a coating step. Therefore, the alkyl group preferably contains three to ten carbon atoms.

The phenyl group caps an end of the luminescent dopant. In order to readily synthesize the luminescent dopant, a starting material containing halogen (particularly bromine) may be subjected to the Suzuki coupling reaction; hence, halogen remains in the luminescent dopant. In order to prevent halogen in the luminescent dopant, the luminescent dopant preferably has the phenyl group.

It is not preferable halogen remain in materials for use in organic EL devices, because halogen has negative effects on the organic EL devices as disclosed in Patent Document 6.

The luminescent dopant has, but not limited to, any one of the following formulas:

Formula XII

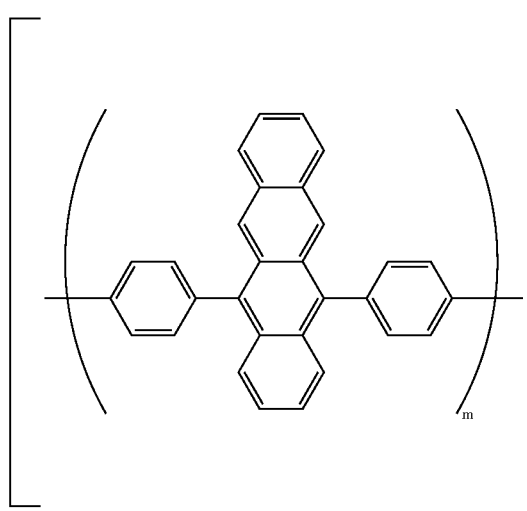 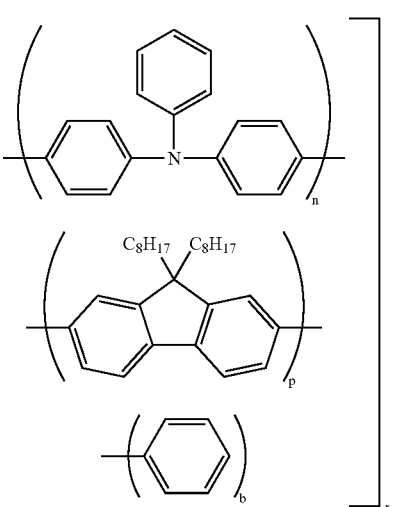
(XII)

Formula XIII

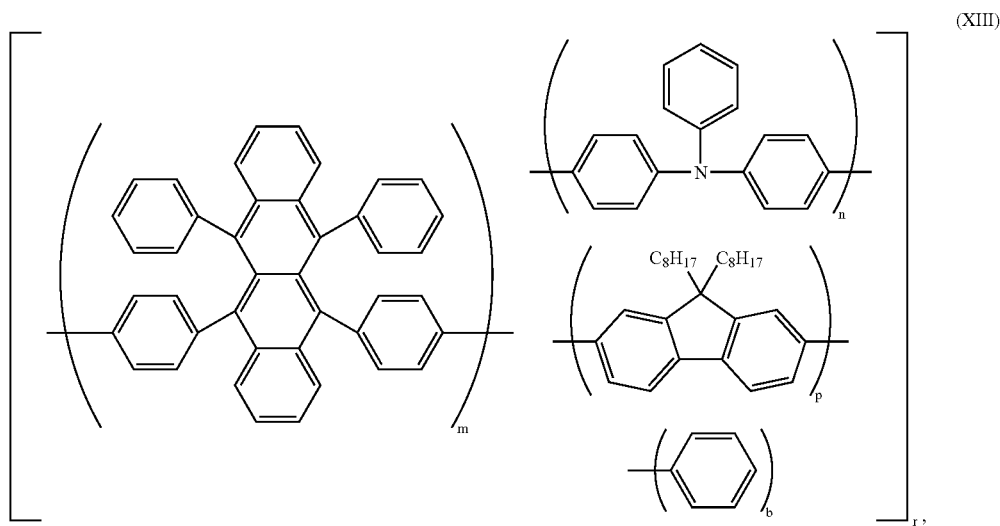
Formula XIV
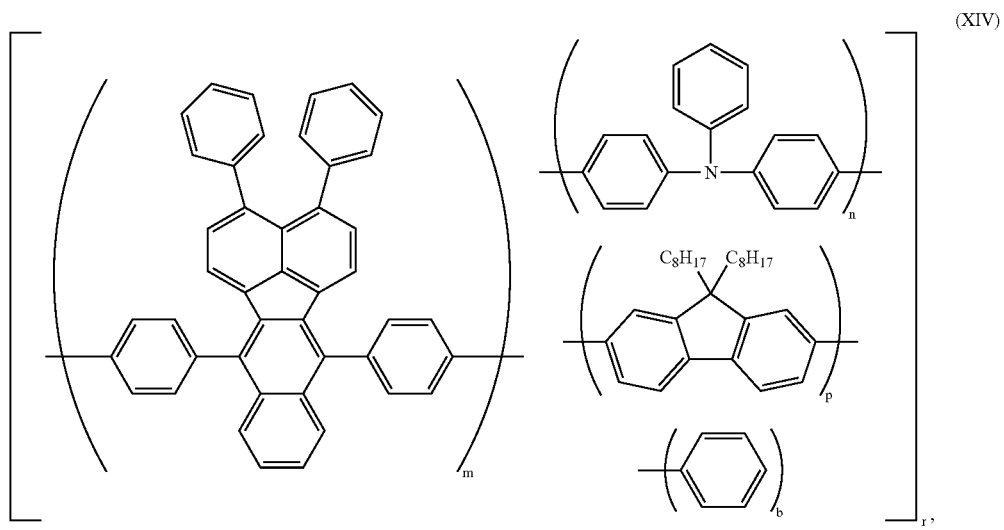

Formula XV
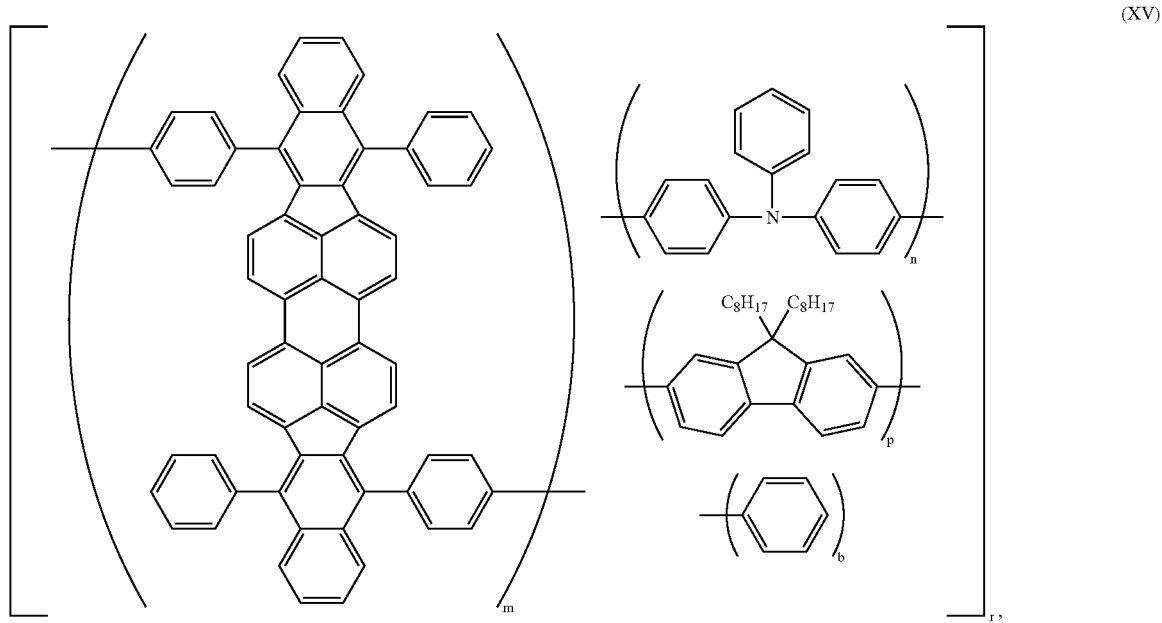
(XV)
Formula XVI
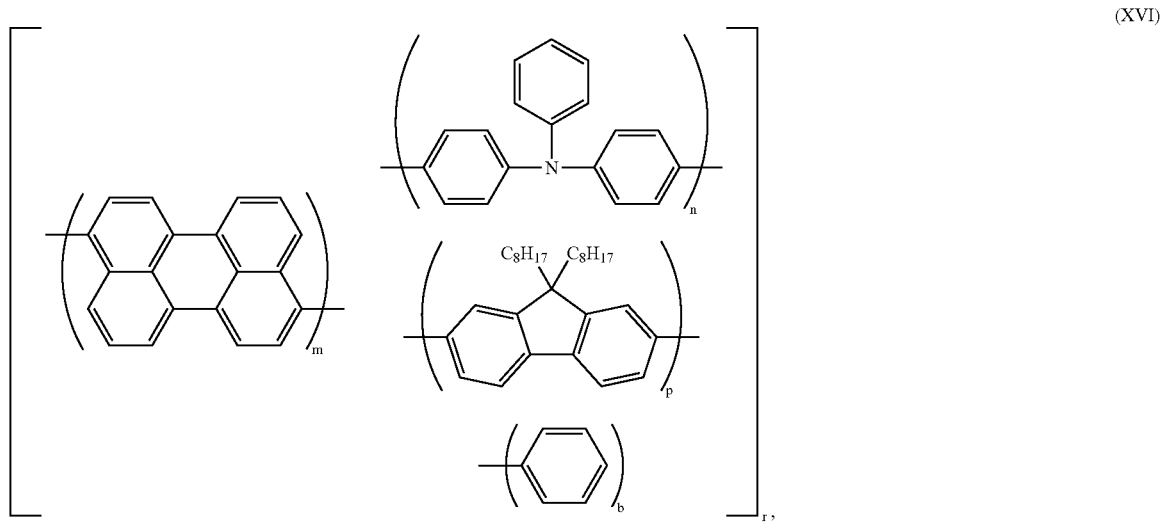
(XVI)

-continued
Formula XVII
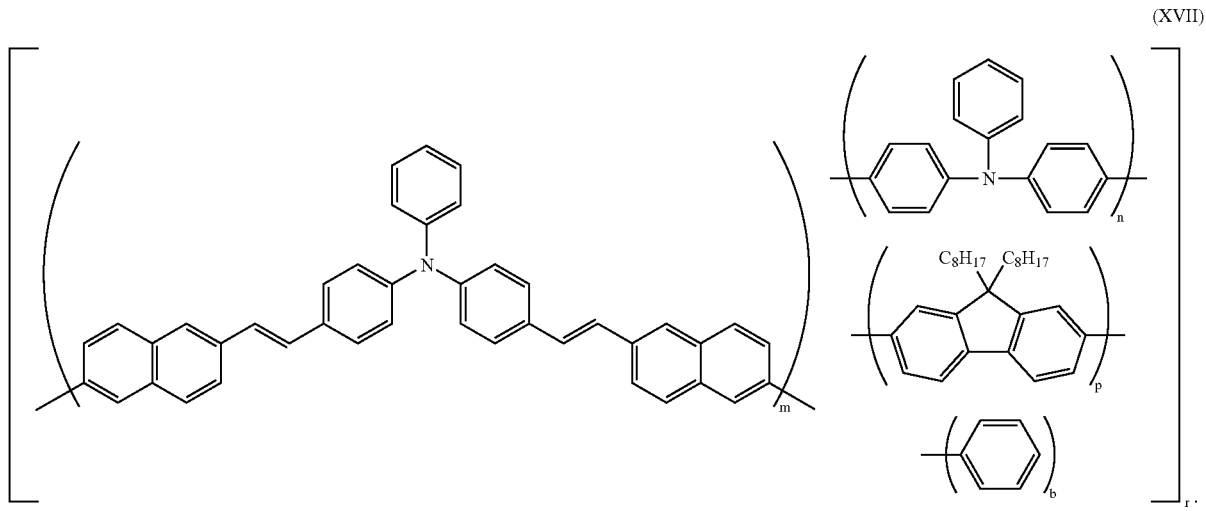
Formula XVIII
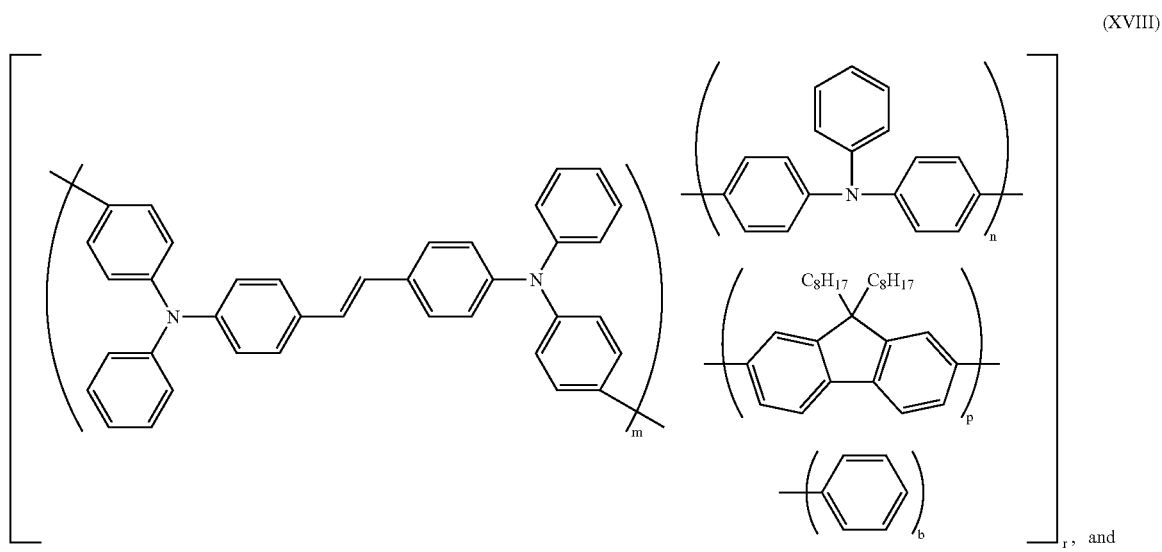
Formula XIX
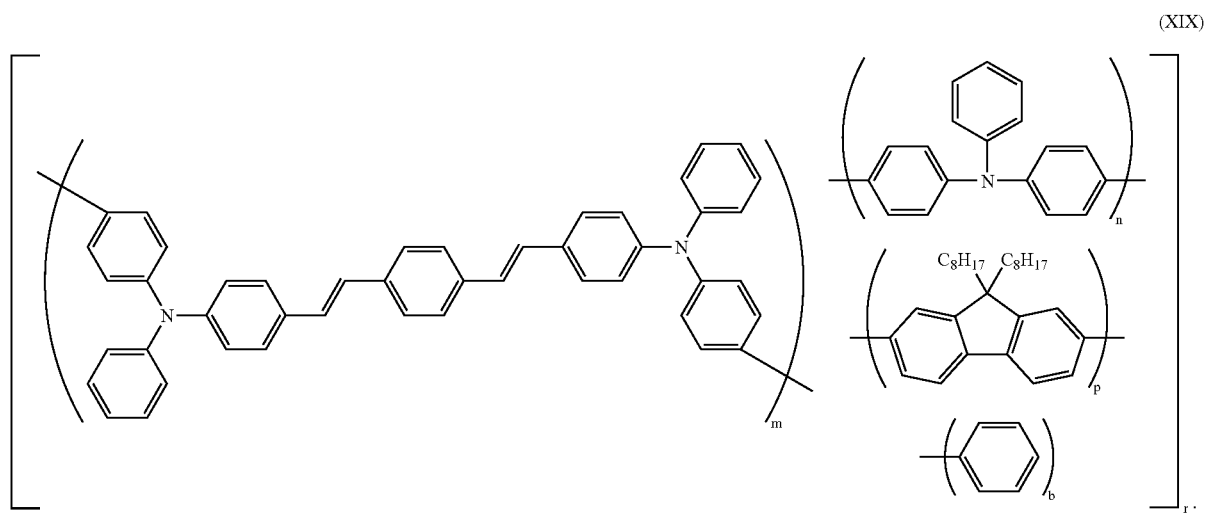

The luminescent dopant traps holes flowing through the light-emitting layer to produce cations. The cations trap electrons flowing through the light-emitting layer; hence, the holes recombine with the electrons This allows a molecular unit which is a luminescent dopant to emit light.

The term "recombine" used above means that the holes and electrons trapped by the luminescent dopant excite the luminescent center.

When the excited luminescent center returns to the ground state, the excited luminescent center releases energy in the form of electroluminescent light.

Since the light emitting layer contains the heat material and the luminescent dopant, the organic EL device has high efficiency and long life.

It is preferable that the luminescent dopant be uniformly distributed in the light-emitting layer. The weight ratio of the host material to the luminescent dopant usually ranges from 100:0.5 to 100:10. When the amount of the luminescent dopant is too small, the number of carriers trapped by the luminescent dopant is small and therefore the energy released from the luminescent center is insufficient. This leads to low brightness. In contrast, when the amount of the luminescent dopant is too large, a sufficient amount of light cannot be obtained because of the concentration quenching of the luminescent dopant.

Since the luminescent dopant is the Π-conjugated oligomer, the weight percentage of the luminescent center in the luminescent dopant is preferably determined as described below.

The luminescent dopant and the host material are preferably contained in the light-emitting layer such that the following formula is satisfied:

$$k=(a/(b+c))\times 100 \qquad (XX)$$

wherein k ranges from 0.5 to 10.0 weight percent, a represents the weight of the luminescent center in the luminescent dopant, b represents the weight of the luminescent dopant in the light-emitting layer, and c represents the weight of the host material in the light-emitting layer.

In the organic EL device, the light-emitting layer is preferably formed by a spin-coating process or a droplet ejection process such as an ink jet process, if the light-emitting layer is formed by such a spin-coating process or a droplet ejection process using the above organic EL compounds, the organic EL device has high light-emitting efficiency and long half-brightness lifetime.

The EL compounds are oligomer or polymer molecules and therefore are compatible with the host material. Hence, the luminescent dopant and the host material can be uniformly distributed in the light-emitting layer.

The organic EL compounds have a large molecular weight and therefore are decomposed if the organic EL compounds are used for a vapor deposition process. This leads to the deterioration of the organic EL device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the present invention will now be described.

First Embodiment

Figure 16:
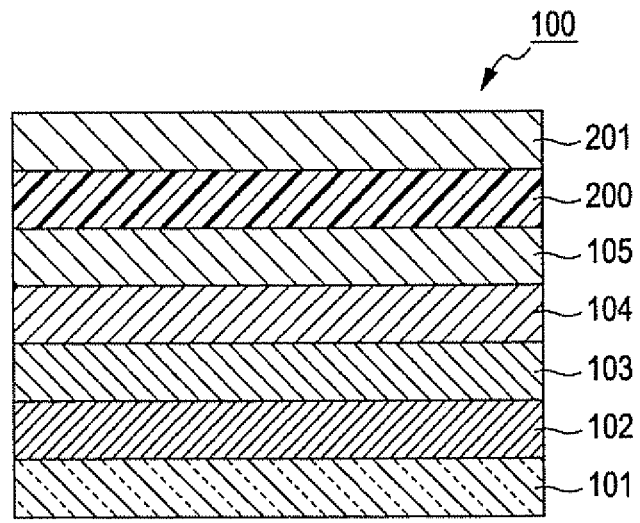
FIG. 16 is a sectional view of an organic EL device according to a first embodiment of the present invention.

FIG. 16 shows an organic EL device 100 according to a first embodiment of the present invention. The organic EL device 100 includes a transparent substrate 101, transparent anodes (first electrodes) 102, a hole injection/transport layer 103 with a thickness of 50 nm, a light-emitting layer 104 with a thickness of 100 nm, and a cathode (second electrode) 105 in series. The cathode 105 includes a lithium fluoride (LiF) layer with a thickness of 1 mm, a calcium (Ca) layer with a thickness of 5 nm, and an aluminum (Al) layer with a thickness of 200 nm. The hole injection/transport layer 103 and light-emitting layer 104 located between the anodes 102 and the cathode 105 form a functional layer. The light emitted from the light-emitting layer 104 is extracted through the transparent substrate 101. Therefore, the organic EL device 100 is of a bottom emission type.

Second Embodiment

Figure 17:
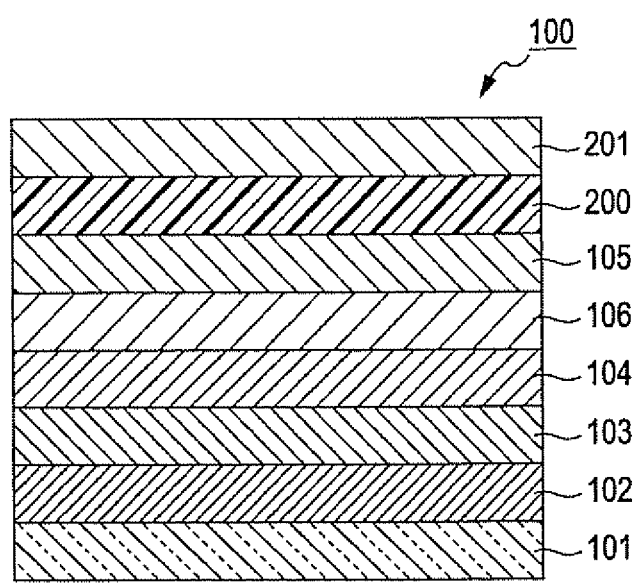
FIG. 17 is a sectional view of an organic EL device according to a second embodiment of the present invention.

FIG. 17 shows an organic EL device 100 according to a second embodiment of the present invention. The organic EL device 100 includes a transparent substrate 101, transparent anodes (first electrodes) 102, a hole injection/transport layer 103 with a thickness of 50 nm, a light-emitting layer 104 with a thickness of 100 nm, an electron transport layer 106 with a thickness of 10 nm, and a cathode (second electrode) 105 in series. The hole injection/transport layer 103, light-emitting layer 104, and electron transport layer 106 located between the anodes 102 and the cathode 105 form a functional layer. The light emitted from the light-emitting layer 104 is extracted through the transparent substrate 101. Therefore, the organic EL device 100 is of a bottom emission type.

The transparent substrate 101 includes a transparent plate such as a glass plate, driving elements such as thin-film transistors (TFTs), and various wires, the driving elements and the wires being arranged above the transparent plate. The anodes 102 are disposed above the driving elements and the wires with an insulating layer and a planarization layer disposed therebetween. The anodes 102 are formed by patterning so as to correspond to pixel regions disposed above the transparent substrate 101 and are connected to the driving elements and the wires. In this embodiment, the anodes 102 are made of indium tin oxide (ITO).

The hole injection/transport layer 103 transports holes, injected from the anodes 102 into the hole injection/transport layer 103, to the light-emitting layer 104 and is made of 3,4-polyethylenedioxythiophene/polystyrenesulfonic acid (PEDOT/PSS). The light-emitting layer 104 contains organic EL compounds such as a host material and a luminescent dopant and emits green light. Therefore, the organic EL device 100 emits green light.

The cathode 105 extends over the pixel regions and includes a LiF layer with a thickness of 1 nm, a Ca layer with a thickness of 5 nm, and an Al layer with a thickness of 200 nm, the LiF, Ca, and Al layers being arranged on the light-emitting layer 104 in that order. The organic EL device 100 further includes a sealing member 200 and a sealing substrate 201 arranged on the cathode 105 in that order. The sealing member 200 joins the sealing substrate 201 to the cathode 105 and is made of a heat- or ultraviolet light-curable resin.

Third Embodiment

A method for manufacturing an organic EL device 100 according to a third embodiment of the present invention will now be described. The method includes an anode-forming step, a substrate-treating step (plasma-treating step), a hole injection/transport layer-forming step, a light-emitting layer-forming step, a cathode-forming step, and a sealing step.

In the anode-forming step, a transparent plate (not shown) made of glass is prepared. TFTs and various wires are formed above the transparent plate by a known process. An interlayer insulating layer and a planarization layer are formed over the TFTs and the wires in that order, whereby a transparent substrate 101 is prepared. An ITO layer is deposited over the planarization layer by a sputtering process or a vapor deposition process and is then patterned by a photolithographic process, whereby anodes 102 serving as pixel electrodes are formed so as to correspond to pixels. Any transparent conductive material may be used to form the anodes 102. For example, indium zinc oxide or the like can be used to form the anodes 102 instead of ITO.

In the substrate-treating step, the glass substrate 101 having the anodes 102 is ultrasonically cleaned in a neutral surfactant, acetone, and then ethanol, taken up from boiling ethanol, and then dried. The transparent substrate 101 is subjected to oxygen plasma treatment at atmospheric pressure so as to have a hydrophilic surface and then set on a spin coating holder in air.

In the hole injection/transport layer-forming step, the transparent substrate 101 having the anodes 102 is spin-coated with an aqueous dispersion of Baytron® P, available from H. C. Starck, for forming a hole injection/transport layer 103. Baytron® P contains PEDOT and PSS in a ratio of 1:2.5 on a weight basis. The resulting transparent substrate 101 is dried at 100° C. for 30 minutes in a nitrogen atmosphere, whereby the hole injection/transport layer 103 is formed. The hole injection/transport layer 103 has a thickness of about 50 nm.

In the light-emitting layer-forming step, a host material and a luminescent dopant are mixed in an appropriate ratio and the mixture is dissolved in a solvent, whereby a solution (ink) is prepared. The solution is applied onto the hole injection/transport layer 103 by a spin-coating process such that a coating with a thickness of, for example, 100 nm is formed. The coating is dried at 100° C. for 30 minutes in a nitrogen atmosphere, whereby a light-emitting layer 104 is formed. The hole injection/transport layer 103 is insoluble in the solution.

A droplet ejection process or an ink jet process may be used to apply the solution onto the hole injection/transport layer 103 instead of the spin-coating process.

In the cathode-forming step, a LiF layer with a thickness of 1 nm, a Ca layer with a thickness of 5 nm, and an Al layer with a thickness of 200 nm are deposited on the light-emitting layer 104 at a pressure of $10^{-7}$ to $10^{-8}$ Torr in a vacuum deposition system in that order, whereby a cathode 105 is formed.

In the sealing step, a sealing member 200 made of a heat- or ultraviolet light-curable resin is provided over the cathode 105. A sealing substrate 201 is attached to the sealing member 200. The sealing step is preferably performed in an inert atmosphere such as a nitrogen atmosphere, an argon atmosphere, or a helium atmosphere.

The organic EL device 100 is obtained as shown in FIG. 16. In the organic EL device 100, the host material and the luminescent dopant are used to form the light-emitting layer 104. Therefore, the organic EL device 100 has excellent light-emitting properties (brightness) and high reliability (long half-brightness lifetime). In particular, the organic EL device 100 has high light-emitting efficiency and long life.

The organic EL device 100 may further include an electron transport layer 106 located between the light-emitting layer 104 and the cathode 105 as shown in FIG. 17. In this case, the method further includes an electron transport layer-forming step. In the electron transport layer-forming step, tris(8-hydroxyquinoline) aluminum (Alq3) is deposited on the light-emitting layer 104 at a pressure of $10^{-7}$ to $10^{-8}$ Torr in a vacuum deposition system, whereby an electron transport layer 106 having a thickness of 10 nm is formed. The cathode 105, the sealing member 200, and the sealing substrate 201 are provided on the electron transport layer 106 in that order in the same manner as that described above.

EXAMPLES

The present invention will now be further described in detail with reference to examples and comparative examples. Techniques for synthesizing materials described in Examples 1 to 3 are based on Patent Document 5. Documents used to synthesize materials described in Examples 1 to 10 are as follows: Macromolecules 1999, 32, 8685-8688; Can. J. Chem. vol. 70, 1015-1021 (1992); Polymers for Advanced Technologies, 15(5), 266-269 (2004); Synthesis, (2), 131-133 (1980); Journal of American Chemical Society, 85 (11), 1561-1564 (1963); and Journal of Organic Chemistry, 62 (3), 530-537.

Example 1

Figure 1:
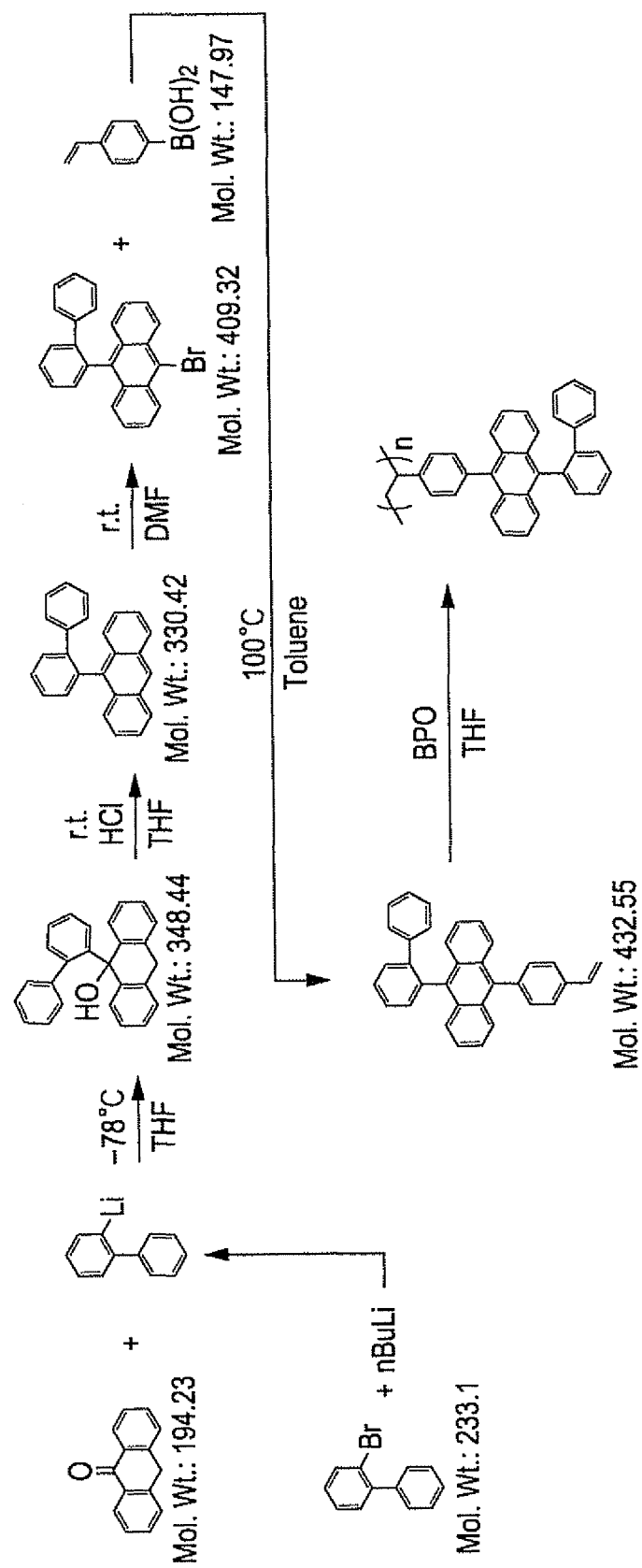
FIG. 1 is a flowchart showing a procedure for synthesizing a host material having Formula I.

A host material, used herein, having Formula I was synthesized by a procedure shown in FIG. 1.

Into a 300-cm$^3$ Schlenk tube filled with argon, 7.2 g (3.1× 10$^{-2}$ mol) of 2-bromobiphenyl was weighed. Into the Schlenk tube, 50 cm$^3$ of sufficiently dehydrated tetrahydrofuran (THF) was poured. The Schlenk tube was cooled to −78° C. In a dry ice-acetone mixture. Into the cooled Schlenk tube, 15.4 cm$^3$ of a 1.5 mol/L hexane solution of n-butyllithium was poured for 10 minutes using a dropping funnel. While the Schlenk tube was being cooled, the mixture in the Schlenk tube was subjected to reaction for one hour. Into the cooled Schlenk tube, 3 g (1.54×10$^{-2}$ mol) of anthrone was accurately weighed. After the addition of anthrone, the Schlenk tube was cooled for one hour and then warmed to room temperature for one hour. Into the Schlenk tube warmed to room temperature, 20 cm$^3$ of distilled water and 100 cm$^3$ of toluene were poured. The mixture in the Schlenk tube was agitated.

The mixture in the Schlenk tube was transferred to a 1-litter separatory funnel. A sufficient amount of toluene was poured into the separatory funnel. The organic layer in the separatory funnel was washed with a sufficient amount of distilled water and then transferred to a beaker. To the organic layer, 5 g of magnesium sulfate. After the organic layer was agitated for about one minute, magnesium sulfate was separated from the organic layer with a sheet of filter paper. The organic layer was concentrated in an evaporator. Hexane was added to the concentrated organic layer, whereby a precipitate was formed. The precipitate was separated from this mixture with a sheet of filter paper. The precipitate was placed into a 500-cm$^3$ eggplant-shaped flask and then dissolved in 100 cm$^3$ of THF. About 10 cm$^3$ of a 35% hydrochloric acid solution was added to the THF solution. The solution mixture was subjected to reaction for one hour at room temperature. To the reaction mixture, 100 cm$^3$ of toluene was added. This mixture was poured into a separatory funnel and then sufficiently washed with toluene and distilled water. The organic layer in this separatory funnel was transferred to a beaker. To this organic layer, 5 g of magnesium sulfate was added. This organic layer was agitated for about one minute. Magnesium sulfate was separated from this organic layer with a sheet of filter paper. The solvents were removed from this organic layer in an evaporator, whereby a dry solid was obtained. The sold was dissolved in about 20 cm$^3$ of dichloromethane. About 40 cm$^3$ of methanol was added to the dichloromethane solution, whereby a yellow precipitate was formed. The yellow precipitate was separated from this mixture by filtration and then dried, whereby 2.3 g of 9-(o-biphenyl)-anthracene was obtained. The yield of 9-(o-biphenyl)-anthracene was 45%.

Into a 200-cm$^3$ eggplant-shaped flask, 2.3 g (7.0×10$^{-3}$ mol) of 9-(o-biphenyl)-anthracene synthesized as described above was placed. Into the eggplant-shaped flask, 50 cm$^3$ of dimethylformamide (DMF) was poured, whereby 9-(o-biphenyl)-anthracene was dissolved in DMF. To the DMF solution, 1.24 g (7.0×10$^{-3}$ mol) of N-bromosuccinimide (NBS) was added. The mixture was subjected to reaction for five hours at room temperature. A sufficient amount of water was added to the reaction mixture. This mixture was subjected to filtration, whereby a yellow filtrate was obtained. The filtrate was purified by silica gel chromatography, whereby 2.5 g of 9-bromo-10-(o-biphenyl)-anthracene was obtained. The yield of 9-bromo-10-(o-biphenyl)-anthracene was 88%.

Into a 300-cm$^3$ Schlenk tube filled with argon, 2.5 g (6.1× 10$^{-3}$ mol) of 9-bromo-10-(o-biphenyl)-anthracene synthesized as described above and 1.0 g (6.7×10$^{-3}$ mol) of styrylboronic acid were charged. Into the Schlenk tube, 50 cm$^3$ of distilled ethanol and 100 cm$^3$ of distilled toluene were poured, whereby a solution was prepared. To the solution, 0.2 g of tetrakis(triphenylphosphine) palladium (Pd(PPh$_3$)$_4$) and 30 cm$^3$ of a saturated aqueous solution of sodium carbonate were added. This mixture was heated at 80° C. for four hours, cooled to room temperature, transferred to a separatory funnel, and then sufficiently washed with toluene and distilled water. The organic layer was removed from the separatory funnel, dried with magnesium sulfate, concentrated in an evaporator, and then purified by silica gel chromatography, whereby 2.1 g of 9-(o-biphenyl)-10-(p-styryl)-anthracene was obtained. The yield of 9-(o-biphenyl)-10-(p-styryl)-anthracene was 80%.

Into a 50-cm$^3$ Schlenk tube filled with argon, 2.1 g (4.9× 10$^{-3}$ mol) of 9-(o-biphenyl)-10-(p-styryl)-anthracene synthesized as described above was placed. Into the Schlenk tube, 3 cm$^3$ of sufficiently dry THF was poured. Furthermore, a small spatula of benzoyl peroxide (BPO) was placed into the Schlenk tube. The mixture in the Schlenk tube was subjected to reaction for 12 hours under reflux. In this operation, 9-(o-biphenyl)-10-(p-styryl)-anthracene was not dissolved in THF in an initial state but was completely dissolved therein with the progress of reaction.

The reaction mixture was added dropwise to ethanol, whereby a target precipitate was obtained.

The target precipitate was purified by reprecipitation as described below.

The target precipitate was dissolved in dichloromethane and the dichloromethane solution was added dropwise to hexane, whereby the target precipitate was re-precipitated. This operation was repeated twice. The resulting target precipitate was dissolved in dichloromethane and this dichloromethane solution was added dropwise to methanol, whereby the target precipitate was re-precipitated. This operation was also repeated twice, whereby 1.0 g of the host material was obtained. The yield of the host material was 50%.

Example 2

Figure 2:
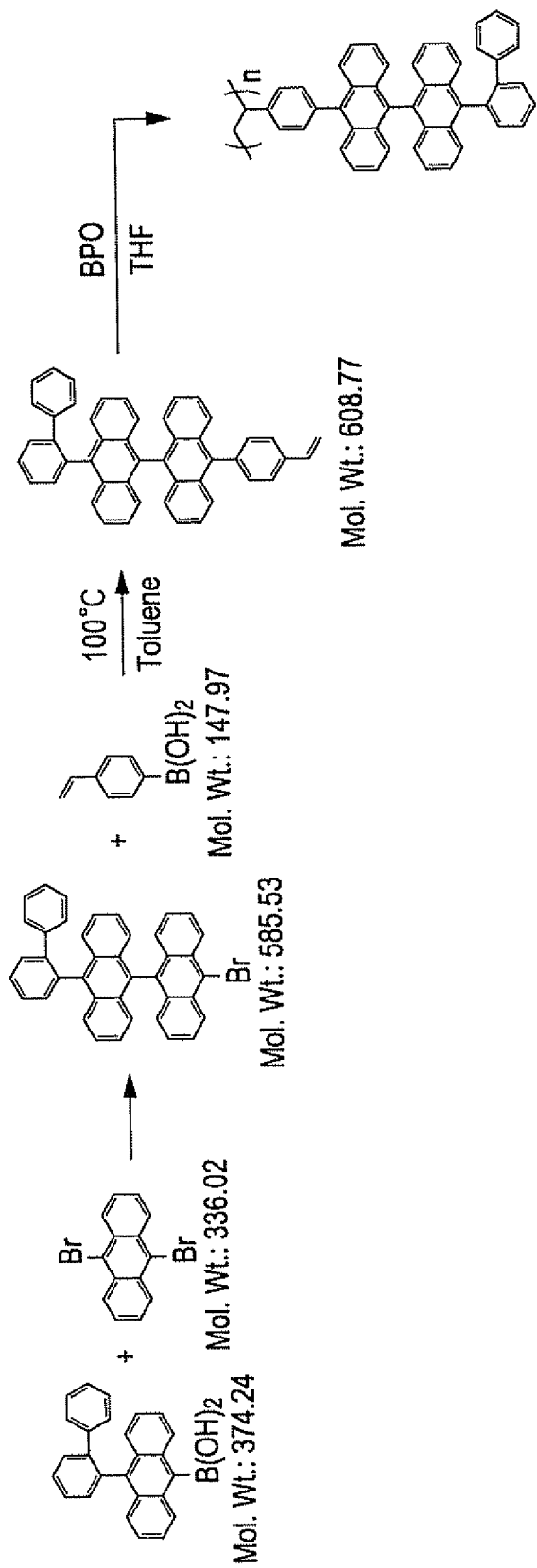
FIG. 2 is a flowchart showing a procedure for synthesizing a host material having Formula II.

A host material, used herein, having Formula II was synthesized by a procedure shown in FIG. 2.

Into a 200-cm$^3$ Schlenk tube filled with argon, 3.0 g (7.3× 10$^{-3}$ mol) of 9-bromo-10-(o-biphenyl)-anthracene synthesized as described in Example 1 was weighed. Into the Schlenk tube, 50 cm$^3$ of sufficiently dehydrated THF was poured. The Schlenk tube was cooled to −78° C. In a dry ice-acetone mixture. Into the cooled Schlenk tube, 5.5 cm$^3$ of a 1.5 mol/L hexane solution of n-butyllithium was poured for 10 minutes using a dropping funnel. While the Schlenk tube was being cooled, the mixture in the Schlenk tube was subjected to reaction for one hour. Into the cooled Schlenk tube, 1.1 g (7.3×10$^{-3}$ mol) of triethyl borate was accurately weighed. The Schlenk tube was cooled for one hour and then warmed to room temperature. A 35% aqueous solution of hydrochloric acid was trickled into the Schlenk tube such that the mixture in the Schlenk tube was neutralized. The pour of the aqueous solution was stopped at the point of time when the mixture in the Schlenk tube was confirmed to be neutral using a strip of pH test paper. The mixture in the Schlenk tube was transferred to a 300-cm$^3$ separatory funnel. Into the separatory funnel, 50 cm$^3$ of THF was poured. The mixture in the separatory funnel was washed with 50 cm$^3$ of a saturated aqueous solution of sodium chloride (NaCl). This operation was repeated three times. The organic layer in the separatory funnel was transferred to an evaporator and then concentrated. A small amount of THF and hexane were added to the concentrated organic layer, whereby 2.0 of 9-(o-biphenyl)-10-anthraceneboronic acid was obtained. The yield of 9-(o-biphenyl)-10-anthraceneboronic acid was 74%.

Into a 200-cm³ Schlenk tube filled with argon, 2.0 (5.3×10⁻³ mol) of 9-(o-biphenyl)-10-anthraceneboronic acid synthesized as described above and 5.4 g (1.6×10⁻² mol) of 9,10-dibromoanthracene were charged. Into the Schlenk tube, 20 cm³ of distilled ethanol and 40 cm³ of distilled toluene were poured, whereby a solution was prepared. To the solution, 0.2 g of tetrakis(triphenylphosphine) palladium (Pd(PPh₃)₄) and 20 cm³ of a saturated aqueous solution of sodium carbonate were added. This mixture was heated at 80° C. for four hours, cooled to room temperature, transferred to a separatory funnel, and then sufficiently washed with toluene and distilled water. The organic layer was removed from the separatory funnel, dried with magnesium sulfate, concentrated in an evaporator, and then purified by silica gel chromatography, whereby 2.5 g of 10-(o-biphenyl)-10'-bromo-9,9'-bianthracene was obtained. The yield of 10-(o-biphenyl)-10'-bromo-9,9'-bianthracene was 80%.

Into a 300-cm³ Schlenk tube filled with argon, 2.5 g (4.3×10⁻³ mol) of 10-(o-biphenyl)-10'-bromo-9,9'-bianthracene synthesized as described above and 0.63 g (4.3×10⁻³ mol) of styrylboronic acid were charged. Into the Schlenk tube, 50 cm³ of distilled ethanol and 100 cm³ of distilled toluene were poured, whereby a solution was prepared. To the solution, 0.2 g of tetrakis(triphenylphosphine) palladium (Pd(PPh₃)₄) and 20 cm³ of a saturated aqueous solution of sodium carbonate were added. This mixture was heated at 80° C. for five hours, cooled to room temperature, transferred to a separatory funnel, and then sufficiently washed with toluene and distilled water. The organic layer was removed from the separatory funnel, dried with magnesium sulfate, concentrated in an evaporator, and then purified by silica gel chromatography, whereby 2.1 g of 10-(o-biphenyl)-10'-(p-styryl)-9,9'-bianthracene was obtained. The yield of 10-(o-biphenyl)-10'-(p-styryl)-9,9'-bianthracene was 80%.

Into a 50-cm³ Schlenk tube filled with argon, 2.1 g (3.4×10⁻³ mol) of 10-(o-biphenyl)-10'-(p-styryl)-9,9'-bianthracene synthesized as described above was placed. Into the Schlenk tube, 4 cm³ of sufficiently dry THF was poured. Furthermore, a small spatula of BPO was placed into the Schlenk tube. The mixture in the Schlenk tube was subjected to reaction for 12 hours under reflux. In this operation, 10-(o-biphenyl)-10'-(p-styryl)-9,9'-bianthracene was not dissolved in THF in an initial state but was completely dissolved therein with the progress of reaction.

The reaction mixture was added dropwise to ethanol, whereby a target precipitate was obtained.

The target precipitate was purified by reprecipitation as described below.

The target precipitate was dissolved in dichloromethane and the dichloromethane solution was added dropwise to hexane, whereby the target precipitate was re-precipitated. This operation was repeated twice. The resulting target precipitate was dissolved in dichloromethane and this dichloromethane solution was added dropwise to methanol, whereby the target precipitate was re-precipitated. This operation was also repeated twice, whereby 1.2 g of the host material was obtained. The yield of the host material was 57%.

Example 3

Figure 3:
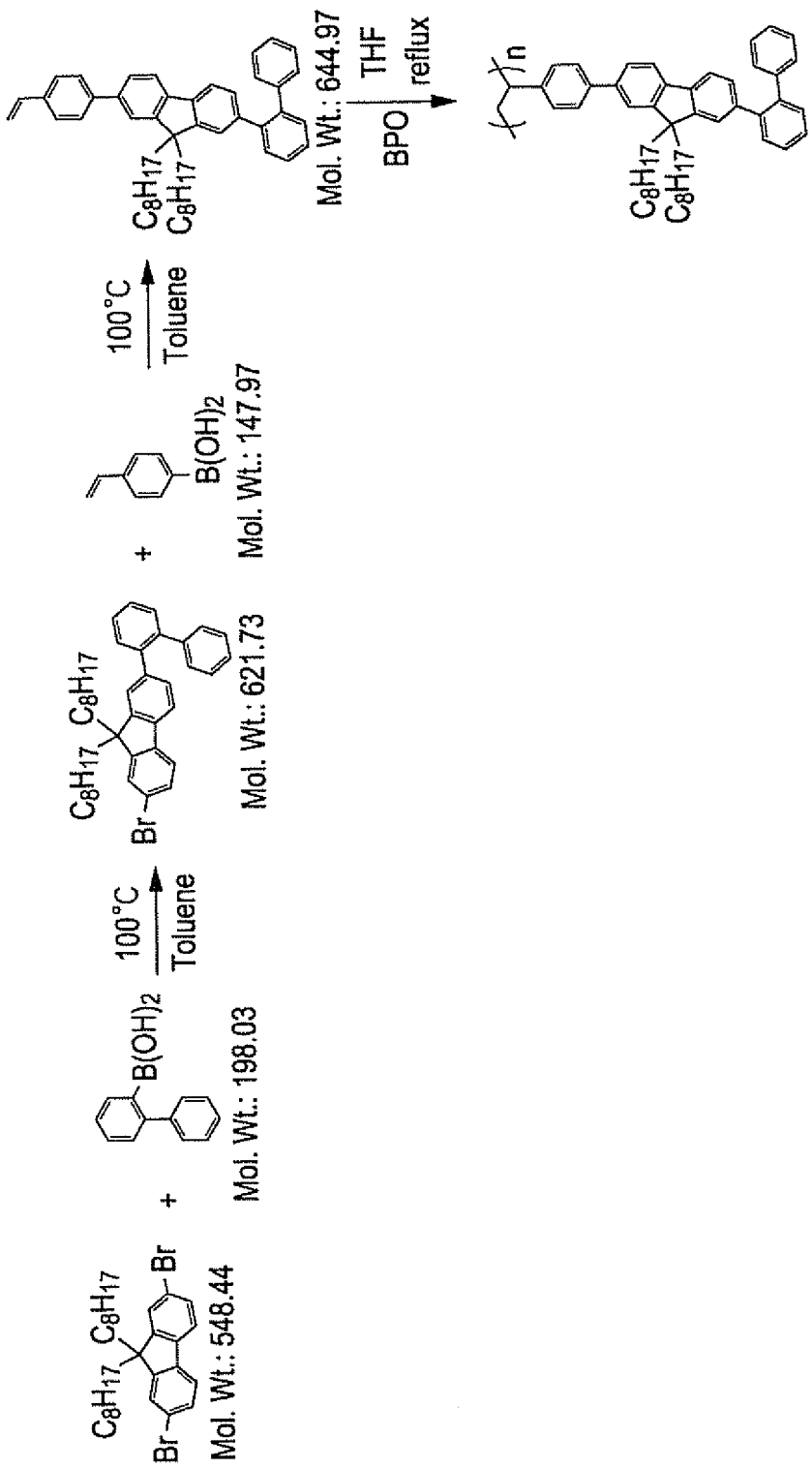
FIG. 3 is a flowchart showing a procedure for synthesizing a host material having Formula III.

A host material, used herein, having Formula III was synthesized by a procedure shown in FIG. 3.

Into a 300-cm³ Schlenk tube filled with argon, 3 g (5.5×10⁻³ mol) of 2,7-dibromo-9,9-di-n-octylfluorene and 1.1 g (5.5×10⁻³ mol) of 2-biphenylboronic acid were charged. Into the Schlenk tube, 50 cm³ of distilled ethanol and 100 cm³ of distilled toluene were poured, whereby a solution was prepared. To the solution, 0.2 g of tetrakis(triphenylphosphine) palladium (Pd(PPh₃)₄) and 20 cm³ of a saturated aqueous solution of sodium carbonate were added. This mixture was heated at 80° C. for four hours, cooled to room temperature, transferred to a separatory funnel, and then sufficiently washed with toluene and distilled water. The organic layer was removed from the separatory funnel, dried with magnesium sulfate, concentrated in an evaporator, and then purified by silica gel chromatography, whereby 3 g of 2-bromo-7-(o-biphenyl)-9,9-di-n-octylfluorene was obtained. The yield of 2-bromo-7-(o-biphenyl)-9,9-di-n-octylfluorene was 88%.

Into a 300-cm³ Schlenk tube filled with argon, 3 g (4.8×10⁻³ mol) of 2-bromo-7-(o-biphenyl)-9,9-di-n-octylfluorene synthesized as described above and 0.7 g (4.7×10⁻³ mol) of 2-styrylboronic acid were charged. Into the Schlenk tube, 50 cm³ of distilled ethanol and 100 cm³ of distilled toluene were poured, whereby a solution was prepared. To the solution, 0.2 g of tetrakis(triphenylphosphine) palladium (Pd(PPh₃)₄) and 20 cm³ of a saturated aqueous solution of sodium carbonate were added. This mixture was heated at 80° C. for five hours, cooled to room temperature, transferred to a separatory funnel, and then sufficiently washed with toluene and distilled water. The organic layer was removed from the separatory funnel, dried with magnesium sulfate, concentrated in an evaporator, and then purified by silica gel chromatography, whereby 2.6 g of 2-(p-styryl)-7-(o-biphenyl)-9,9-di-n-octylfluorene was obtained. The yield of 2-(p-styryl)-7-(o-biphenyl)-9,9-di-n-octylfluorene was 84%.

Into a 50-cm³ Schlenk tube filled with argon, 2.5 g (3.8×10⁻³ mol) of 2-(p-styryl)-7-(o-biphenyl)-9,9-di-n-octylfluorene synthesized as described above was placed. Into the Schlenk tube, 4 cm³ of sufficiently dry THF was poured. Furthermore, a small spatula of BPO was placed into the Schlenk tube. The mixture in the Schlenk tube was subjected to reaction for 12 hours under reflux. In this operation, 2-(p-styryl)-7-(o-biphenyl)-9,9-di-n-octylfluorene was not dissolved in THF in an initial state but was completely dissolved therein with the progress of reaction.

The reaction mixture was added dropwise to ethanol, whereby a target precipitate was obtained.

The target precipitate was purified by reprecipitation as described below.

The target precipitate was dissolved in dichloromethane and the dichloromethane solution was added dropwise to hexane, whereby the target precipitate was re-precipitated. This operation was repeated twice. The resulting target precipitate was dissolved in dichloromethane and this dichloromethane solution was added dropwise to methanol, whereby the target precipitate was re-precipitated. This operation was also repeated twice, whereby 1.5 g of the host material was obtained. The yield of the host material was 60%.

Example 4

Figure 4:
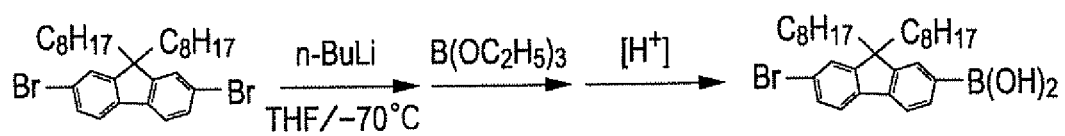
FIG. 4 is a flowchart showing a procedure for synthesizing an intermediate used to synthesize luminescent dopants.

By a procedure shown in FIG. 4, 2-bromo-9,9-n-octylfluorenyl-7-boronic acid was synthesized.

Into a 200-cm³ Schlenk tube filled with argon, 4 g (7.3×10⁻³ mol) of 2,7-dibrom-9,9-di-n-octylfluorene and 100 cm³ of THF dried with sodium were charged, whereby a THF solution was prepared.

The THF solution was cooled to −70° C. To the THF solution, 4.9 cm³ of a 1.5 mol/L hexane solution of n-butyllithium was added. The solution mixture was allowed to stand for one hour. While the solution mixture was being cooled, 1.1 g (7.5×10⁻³ mol) of triethyl borate was added to the solution mixture. This mixture was subjected to reaction for 1.5 hours. The reaction mixture was warmed to 5° C. To the reaction mixture, 5 cm³ of a 40% aqueous solution of hydrochloric acid was added. After this mixture was allowed to stand for one hour, the pH value of this mixture was adjusted to seven with a saturated aqueous solution of sodium carbonate. This mixture was transferred to a separatory funnel. The organic layer, which contained THF, was removed from the separatory funnel. An adequate amount of magnesium sulfate was added to the organic layer, whereby water was removed from the organic layer. After magnesium sulfate was removed from the organic layer with a sheet of filter paper, hexane was added to the resulting organic layer, whereby a target precipitate was obtained.

The target precipitate was purified by reprecipitation using THF and hexane, whereby 2-bromo-9,9-di-n-octyl-7-fluoreneboronic acid was obtained as shown in FIG. 4.

Example 5

Figure 5:
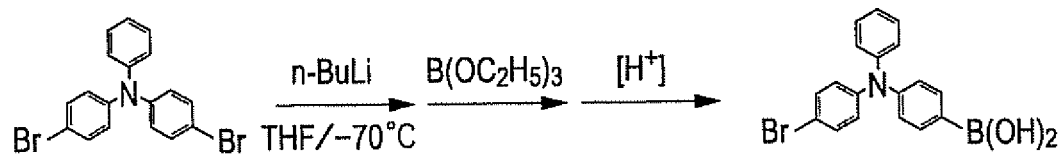
FIG. 5 is a flowchart showing a procedure for synthesizing another intermediate used to synthesize luminescent dopants.

By a procedure shown in FIG. 5, 4-bromo-triphenylaminoboronic acid was synthesized.

Into a 200-cm³ Schlenk tube filled with argon, 4 g (9.9× $10^{-3}$ mol) of commercially available 4,4'-dibromo-triphenylamine and 100 cm³ of THF dried with sodium were charged, whereby a THF solution was prepared.

The THF solution was cooled to −70° C. To the THF solution, 9.9 cm³ (1.48×$10^{-2}$ mol) of a 1.5 mol/L hexane solution of n-butyllithium was added. The solution mixture was allowed to stand for one hour. While the solution mixture was being cooled, 1.9 g (1.3×$10^{-2}$ mol) of triethyl borate was added to the solution mixture. This mixture was subjected to reaction for 1.5 hours. The reaction mixture was warmed to 5° C. To the reaction mixture, 5 cm³ of a 40% aqueous solution of hydrochloric acid was added. After this mixture was allowed to stand for one hour, the pH value of this mixture was adjusted to seven with a saturated aqueous solution of sodium carbonate. This mixture was transferred to a separatory funnel. The organic layer, which contained THF, was removed from the separatory funnel. An adequate amount of magnesium sulfate was added to the organic layer, whereby water was removed from the organic layer. After magnesium sulfate was removed from the organic layer with a sheet of filter paper, hexane was added to the resulting organic layer, whereby a target precipitate was obtained.

The target precipitate was purified by reprecipitation using THF and hexane, whereby 1.4 g of 4-bromo-triphenylaminoboronic acid was obtained as shown in FIG. 5. The yield of 4-bromo-triphenylaminoboronic acid was 40%.

Example 6

Figure 6:
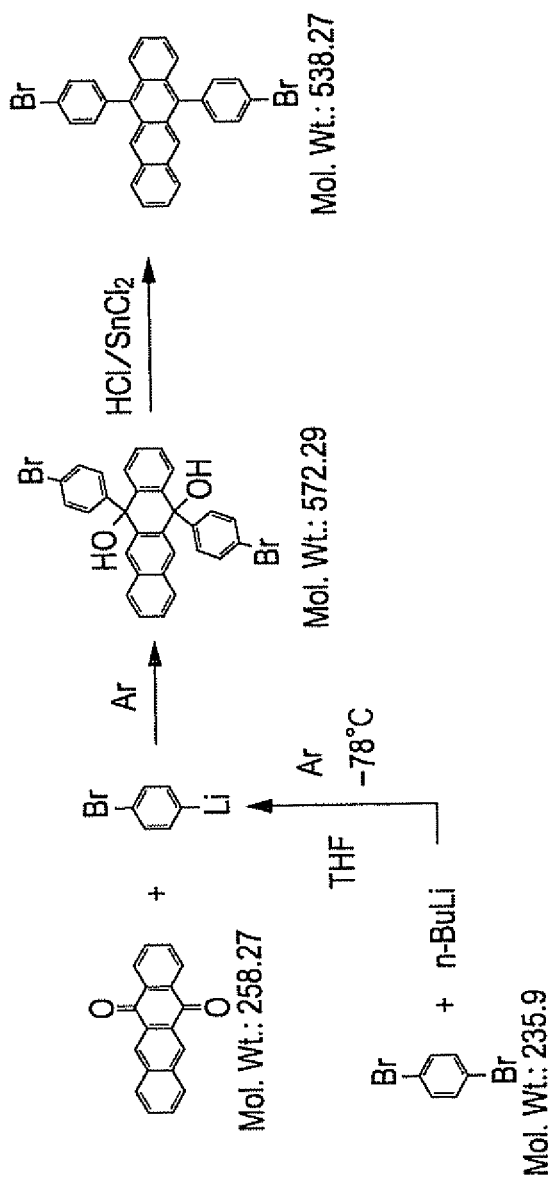
FIG. 6 is the first half of a flowchart showing a procedure for synthesizing a luminescent dopant having Formula XII.
Figure 7:
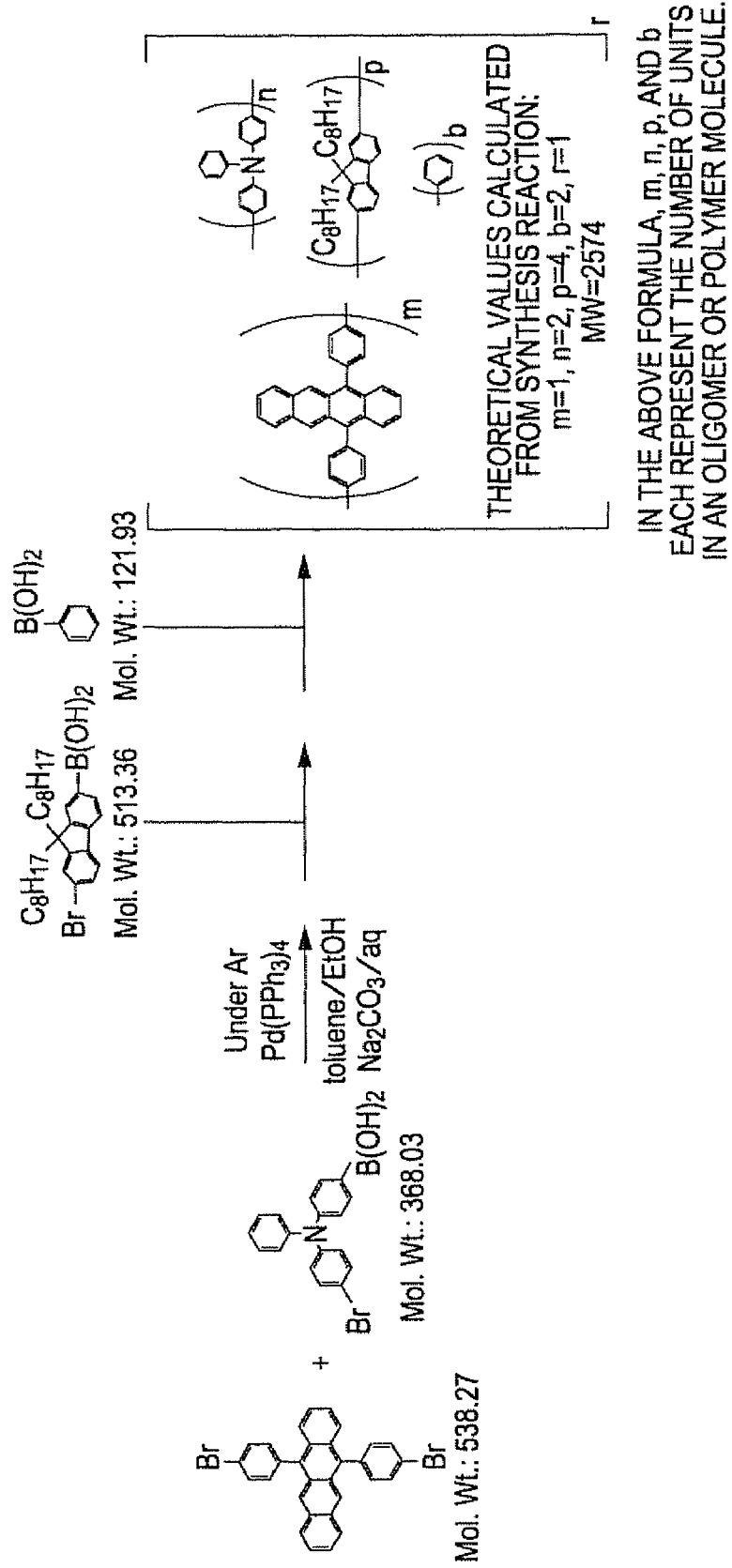
FIG. 7 is the second half of the flowchart showing the procedure for synthesizing the luminescent dopant having Formula XII.

A luminescent dopant, used herein, having Formula XII was synthesized by a procedure shown in FIGS. 6 and 7.

Into a 500-cm³ Schlenk tube filled with argon, 2 g (7.7× $10^{-3}$ mol) of 5,12-tetracenequinone and 100 cm³ of dry THF, which was used as a solvent, were charged, whereby a THF solution of 5,12-tetracenequinone was prepared. The THF solution of 5,12-tetracenequinone was cooled to −78° C. with dry ice. Into a 300-cm³ Schlenk tube, 4.6 g (1.9×$10^{-2}$ mol) of 1,4-dibromobenzene was weighed. Into the 300-cm³ Schlenk tube, 100 cm³ of dry THF was poured, whereby a THF solution of 1,4-dibromobenzene was prepared. The THF solution of 1,4-dibromobenzene was cooled to −78° C. with dry ice.

To the THF solution of 1,4-dibromobenzene, 11.3 cm³ of a 1.5 mol/L hexane solution of n-butyllithium was added. The solution mixture was allowed to stand for one hour. The solution mixture was added to the THF solution of 5,12-tetracenequinone with a dropper in such a manner that solution mixture was prevented from coming into contact with air. This mixture was subjected to reaction for three hours while this mixture was being cooled with dry ice. The reaction mixture was allowed to stand overnight at room temperature. The reaction mixture was transferred to a separatory funnel and then sufficiently washed with toluene and distilled water. The organic layer was removed from the separatory funnel and then dried with 5 g of magnesium sulfate. The solvents were removed from the organic layer in an evaporator, whereby a white solid was obtained. The white solid was purified by silica gel chromatography using toluene and reprecipitation using dichloromethane and hexane, whereby 3.5 g of 5,12-bis(4-bromophenyl)-5,12-dihydroxytetracene was obtained as shown in FIG. 6. The yield of 5,12-bis(4-bromophenyl)-5,12-dihydroxytetracene was 84%.

Into a 300-cm³ eggplant-shaped flask filled with air, 3.0 g (5.22×$10^{-3}$ mol) of 5,12-bis(4-bromophenyl)-5,12-dihydroxytetracene synthesized as described above was weighed. Into the eggplant-shaped flask, 150 cm³ of acetic acid, which was used as a solvent, was poured, whereby an acetic acid solution was prepared. Stannous chloride and a 35% of aqueous solution of hydrochloric acid were mixed at a weight ratio of 1:1, whereby a hydrochloric acid solution of stannous chloride was prepared. To the acetic acid solution, 20 cm³ of the hydrochloric acid solution was added. The solution mixture was subjected to reaction for three hours at room temperature. The reaction mixture was transferred to a separatory funnel. Toluene was added to the reaction mixture. This mixture was sufficiently washed with distilled water. The organic layer in the separatory funnel was dried with 5 g of magnesium sulfate. The solvents were removed from the organic layer in an evaporator, whereby a white solid was obtained. The white solid was purified by silica gel chromatography using a mixture containing toluene and hexane at a ratio of 1:2 and reprecipitation using dichloromethane and hexane, whereby 2.3 g of 5,12-bis(4-bromophenyl)-tetracene was obtained as shown in FIG. 6. The yield of 5,12-bis(4-bromophenyl)-tetracene was 82%.

Into a 200-cm³ Schlenk tube filled with argon, 0.5 g (9.29× $10^{-4}$ mol) of 5,12-bis(4-bromophenyl)-naphthacene synthesized as described above and 0.68 g (1.86×$10^{-3}$ mol) of 4-bromo-triphenylaminoboronic acid synthesized as described in Example 5 were charged. Into the Schlenk tube, 50 cm³ of distilled ethanol and 100 cm³ of distilled toluene were poured, whereby a solution was prepared. To the solution, 0.1 g of tetrakis(triphenylphosphine) palladium (Pd (PPh₃)₄) and 30 cm³ of a saturated aqueous solution of sodium carbonate were added. This mixture was heated at 80° C. for one hour. To this mixture, 1.9 g (1.72×$10^{-3}$ mol) of 2-bromo-9,9-di-n-octyl-7-fluoreneboronic acid synthesized as described in Example 4 and 0.1 g of tetrakis(triphenylphosphine) palladium (Pd(PPh₃)₄) were added. This mixture was subjected to reaction for five hours.

To the reaction mixture, 0.23 g (1.86×$10^{-3}$ mol) of commercially available phenylboronic acid was added. This mixture was subjected to reaction for five hours. This reaction mixture was bubbled with air for 30 minutes while this reaction mixture was being heated. This reaction mixture was cooled to room temperature, transferred to a 1-litter separatory funnel, and then subjected to extraction using toluene. The toluene layer in the separatory funnel was sufficiently washed with distilled water and then sufficiently dried with magnesium sulfate. The solvents were removed from the toluene layer, whereby a yellow solid was obtained. The yellow solid was purified by silica gel chromatography and reprecipitation using a dichloromethane-hexane system and a dichloromethanemethanol system, whereby 0.52 g of the luminescent dopant was obtained as shown in FIG. 7. The molecular weight of the luminescent dopant was determined to be 2,574. The yield of the luminescent dopant was 22%.

Example 7

Figure 8:
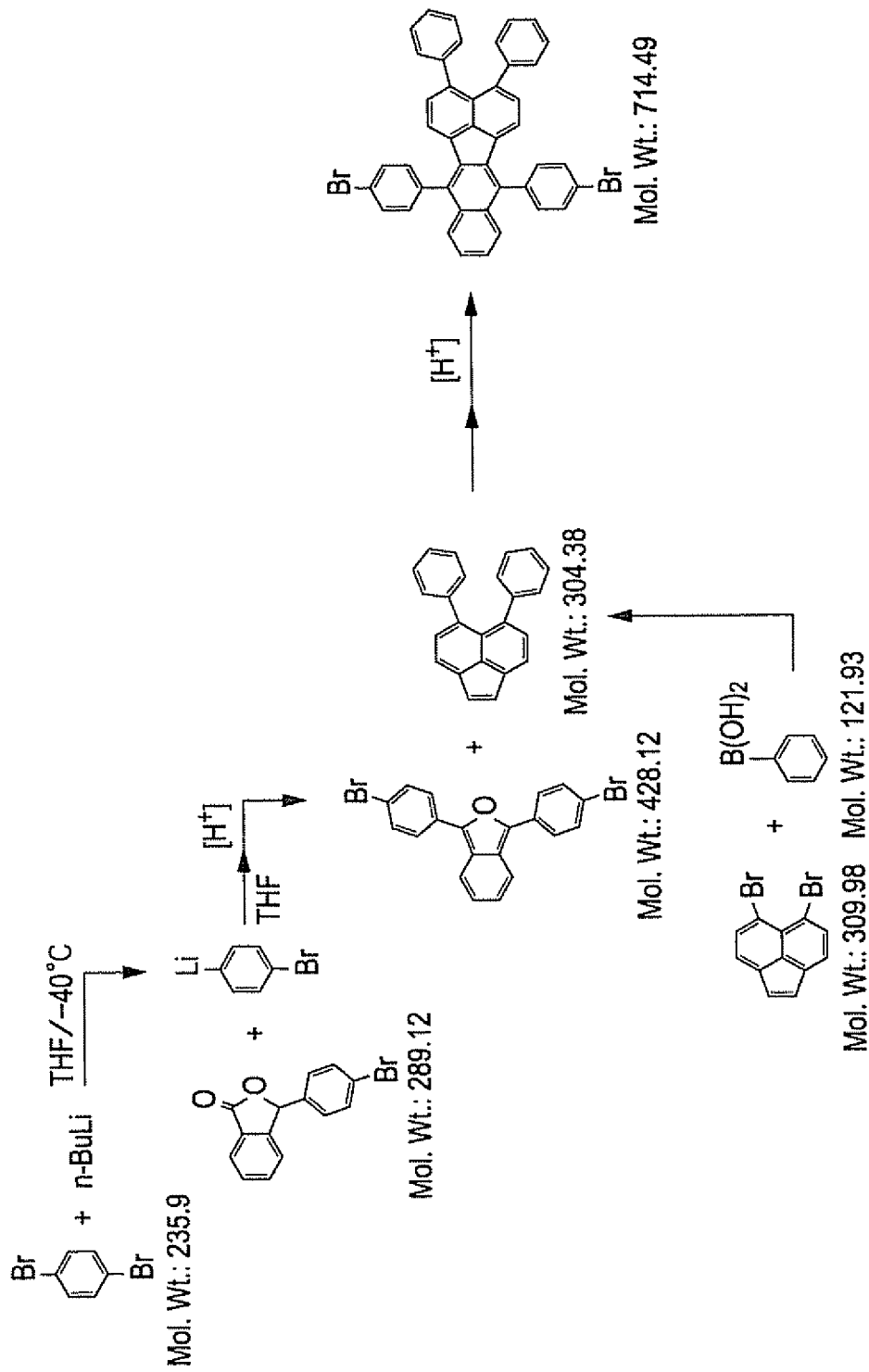
FIG. 8 is the first half of a flowchart showing a procedure for synthesizing a luminescent dopant having Formula XIV.
Figure 9:
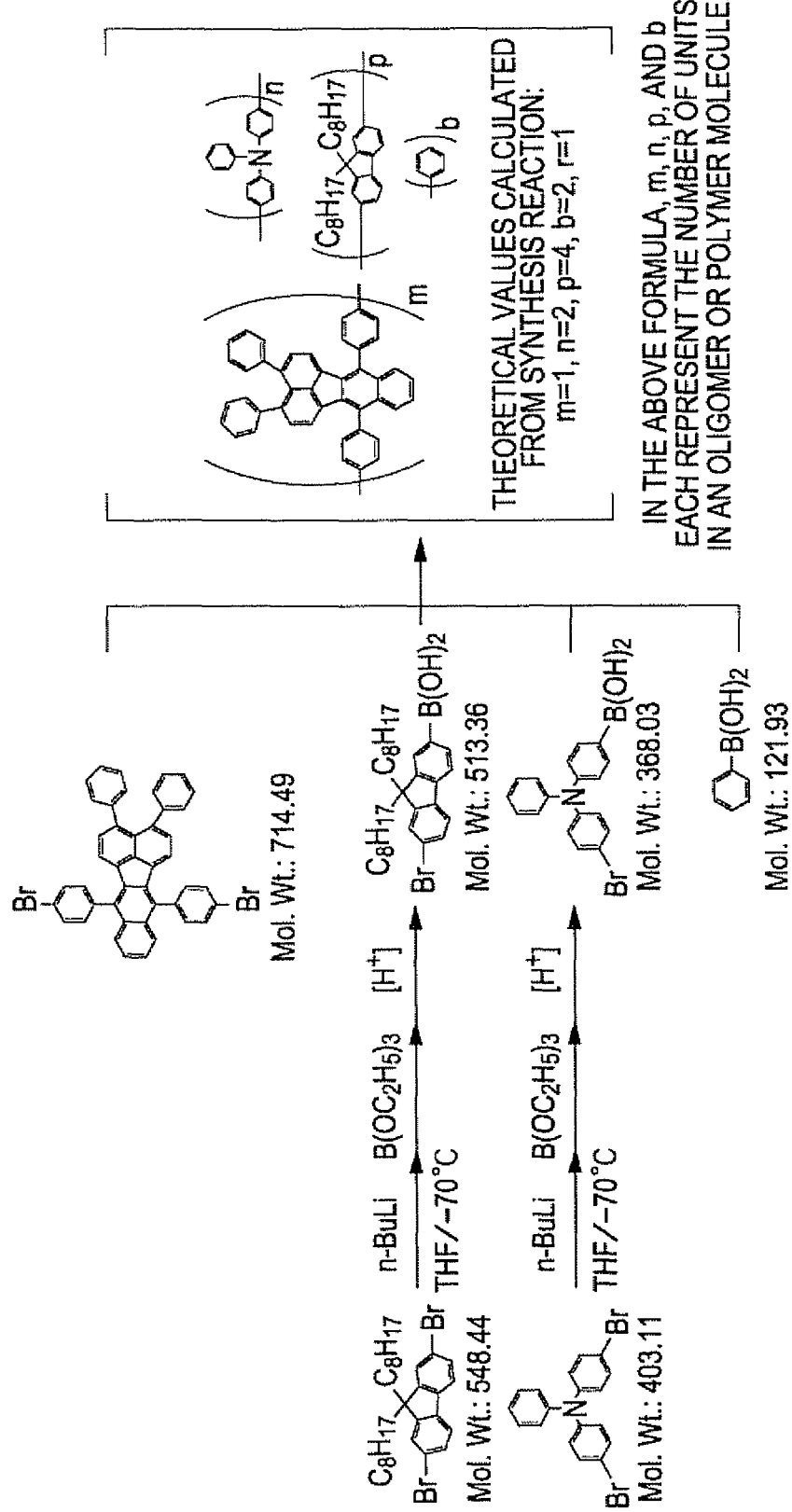
FIG. 9 is the second half of the flowchart showing the procedure for synthesizing the luminescent dopant having Formula XIV.

A luminescent dopant, used herein, having Formula XIV was synthesized by a procedure shown in FIGS. 8 and 9.

Into a 200-cm$^3$ Schlenk tube filled with argon, 5 g (1.61× $10^{-2}$ mol) of 5,6-dibromoacenaphthylene and 4.13 g (3.4× $10^{-2}$ mol) of commercially available phenylboronic acid were weighed. Into the Schlenk tube, 50 cm$^3$ of distilled ethanol and 100 cm$^3$ of distilled toluene were poured, whereby a solution was prepared. To the solution, 1.1 g of tetrakis(triphenylphosphine) palladium (Pd(PPh$_3$)$_4$) and 30 cm$^3$ of a saturated aqueous solution of sodium carbonate were added. This mixture was subjected to reaction at 80° C. for ten hours.

The reaction mixture was cooled to room temperature, transferred to a 1-litter separatory funnel, and subjected to extraction using toluene. The toluene layer in the separatory funnel was sufficiently washed with distilled water and then sufficiently dried with magnesium sulfate. The solvents were removed from the toluene layer in an evaporator, whereby a yellow solid was obtained. The yellow solid was purified by silica gel chromatography using hexane and toluene and reprecipitation using dichloromethane and hexane. The molecular weight of the purified solid was determined to be 304. In this operation, 3 g of 5,6-diphenylacenaphthylene was obtained as shown in FIG. 8. The yield of 5,6-diphenylacenaphthylene was 60%.

Into a 200-cm$^3$ Schlenk tube filled with argon, 3 g (9.9× $10^{-3}$ mol) of 5,6-diphenylacenaphthylene synthesized as described above and 4.2 g (9.9×$10^{-3}$ mol) of 1,3-bis(4-bromo phenyl)-isobenzofuran were weighed. Into the Schlenk tube, 100 cm$^3$ of dry xylene, which was used as a solvent, was poured. The mixture was subjected to reaction at 130° C. for 24 hours. The reaction mixture was subjected to extraction using chloroform, whereby a white solid was obtained. The white solid was purified by silica gel chromatography using toluene and reprecipitation using dichloromethane and hexane. The molecular weight of the purified solid was determined to be 714. In this operation, 3.2 g of a target intermediate was obtained as shown in FIG. 8. The yield of the target intermediate was 44%.

Into a 500-cm$^3$ flask, 3 g of the target intermediate and 200 cm$^3$ of acetic acid were charged. The mixture was heated at 130° C. for one hour and then cooled to 100° C. To the mixture, 30 cm$^3$ of a 48% aqueous solution of hydrogen bromide was added. After this mixture was heated for 30 minutes, water was added to this mixture, whereby a solid was obtained.

The solid was sufficiently washed with distilled water and methanol and then purified by silica gel chromatography using toluene and hexane and reprecipitation using dichloromethane and hexane, whereby 2.2 g of a derivative of 3,4,7,12-tetraphenyl-benzo[k]fluoranthene was obtained as shown in FIG. 8. The yield of the 3,4,7,12-tetraphenyl-benzo[k]fluoranthene derivative was 76%.

The luminescent dopant was synthesized in substantially the same manner as that for synthesizing the luminescent dopant of Example 6 except that the 3,4,7,12-tetraphenyl-benzo[k]fluoranthene derivative was used. In this example, 0.6 g of the luminescent dopant was obtained as shown in FIG. 9. The molecular weight of the luminescent dopant was determined to be 2,746. The yield of the luminescent dopant was 43%.

Example 8

Figure 10:
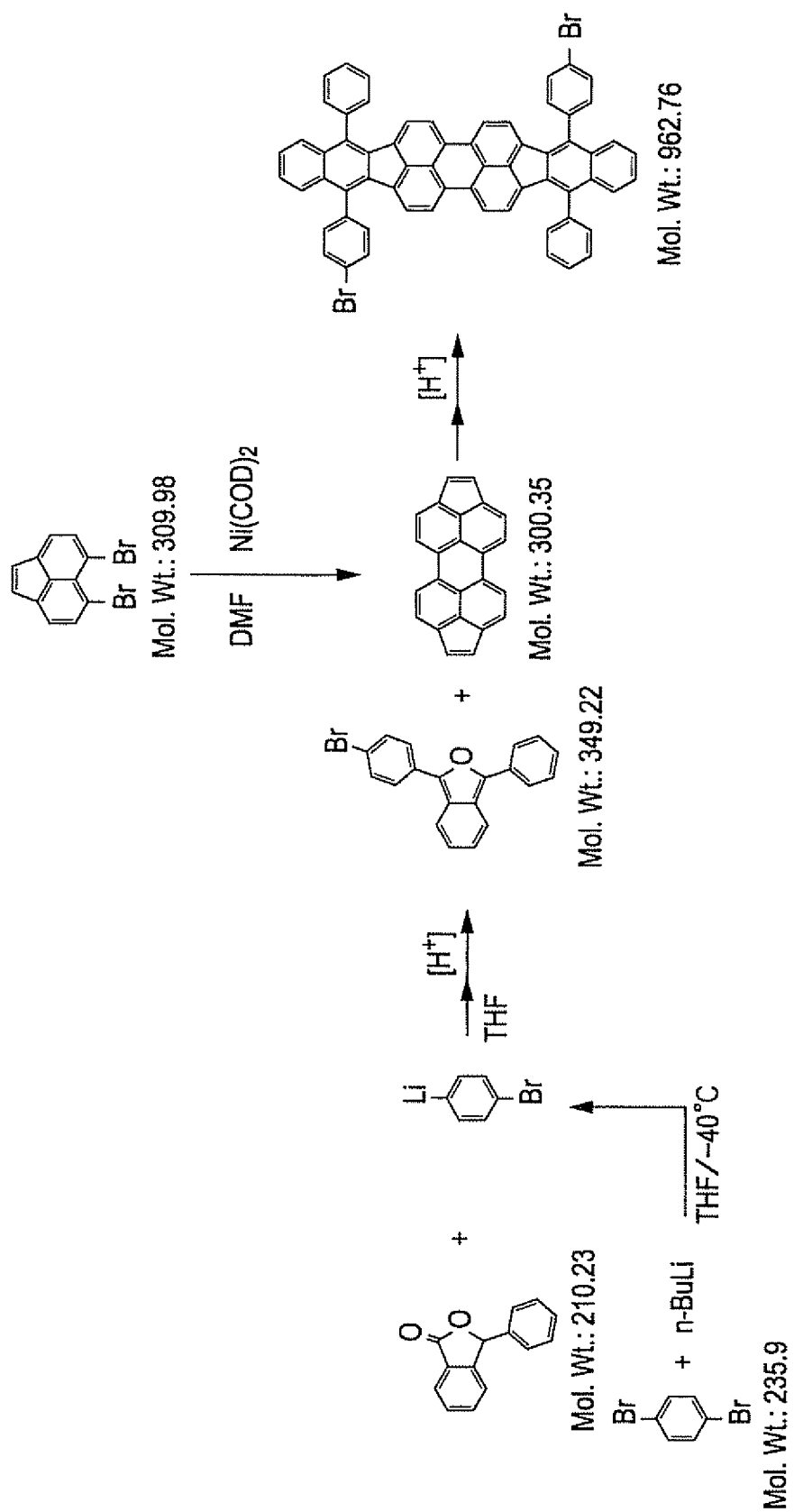
FIG. 10 is the first half of a flowchart showing a procedure for synthesizing a luminescent dopant having Formula XV.
Figure 11:
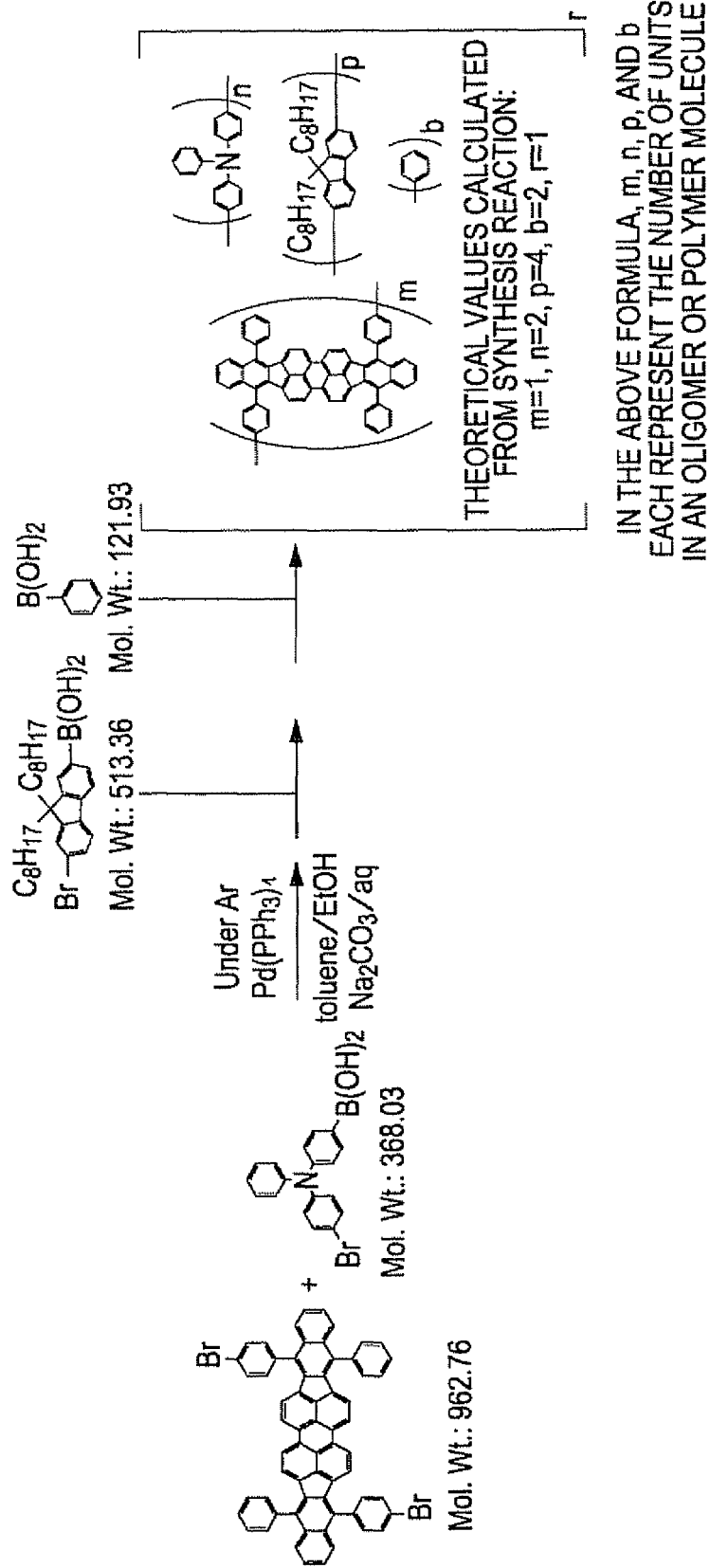
FIG. 11 is the second half of the flowchart showing the procedure for synthesizing the luminescent dopant having Formula XV.

A luminescent dopant, used herein, having Formula XV was synthesized by a procedure shown in FIGS. 10 and 11.

Into a 200-cm$^3$ Schlenk tube filled with argon, 5.0 g (2.12× $10^{-2}$ mol) of 1,4-dibromobenzene was weighed. Into the Schlenk tube, 100 cm$^3$ of dehydrated THF was poured, whereby a THF solution was prepared. After the THF solution was cooled to −50° C., 12.7 cm$^3$ (1.9×$10^{-2}$ mol) of a 1.5 mol/L hexane solution of n-butyllithium was added to the THF solution. The solution mixture was agitated for 1.5 hours while being cooled. To the resulting solution mixture, 4 g (1.9×$10^{-2}$ mol) of 3-phenylphthalide was added. This mixture was cooled for two hours and then warmed to room temperature. To this mixture, 30 cm$^3$ of a 35% aqueous solution of hydrochloric acid was added. This mixture was allowed to stand for one hour, transferred to a separatory funnel, and then subjected to extraction using toluene. The toluene layer in the separatory funnel was sufficiently washed with distilled water and then concentrated. The resulting toluene layer was fractionated by silica gel chromatography using a mixture containing toluene and hexane at a ratio of 1:4, whereby 4.65 g of 1-bromophenyl-3-phenylisobenzofuran was obtained as shown in FIG. 10. The yield of 1-bromophenyl-3-phenyl-isobenzofuran was 70%.

Into a 200-cm$^3$ Schlenk tube filled with argon, 5 g (1.61× $10^{-2}$ mol) of 5,6-dibromoacenaphthylene and dry dimethylformamide (DMF), which was used as a solvent, were charged. The mixture was heated at 90° C., whereby a DMF solution was prepared. To the DMF solution, 4.5 g (1.61×$10^{-2}$ mol) of bis(1,5-cyclooctadiene) nickel(0) (Ni(COD)$_2$), 2.52 g (1.61×$10^{-2}$ mol) of 2,2'-bipyridine, and 1 cm$^3$ of cyclooctadiene were added. This mixture was subjected to reaction at 90° C. for five hours.

The reaction mixture was cooled to room temperature. To the resulting reaction mixture, 50 cm$^3$ of methanol and 15 cm$^3$ of a 45% aqueous solution of hydrochloric acid were added, whereby a precipitate was formed. The precipitate was separated from this mixture by filtration and then sufficiently washed with distilled water and methanol. The resulting precipitate was dissolved in 300 cm$^3$ of chloroform, whereby a chloroform solution was prepared. Impurities were removed from the chloroform solution with silica gel. A solid obtained from the resulting chloroform solution was purified by reprecipitation using dichloromethane and hexane, whereby 0.9 g of dicyclopenta[cd,lm]perylene was obtained as shown in FIG. 10. The yield of dicyclopenta[cd,lm]perylene was 38%.

Into a 200-cm$^3$ Schlenk tube filled with argon, 3 g (8.6× $10^{-3}$ mol) of 1-bromophenyl-3-phenylisobenzofuran synthesized as described above, 1 g (3.43≤$10^{-3}$ mol) of dicyclopenta[cd,lm]perylene, and 100 cm$^3$ of dry distilled xylene were added. The mixture was subjected to reaction at 130° C. for 20 hours.

A precipitate was separated from the reaction mixture by filtration and then washed with 300 cm$^3$ of hot chloroform, whereby 2 g of a target intermediate was obtained as shown in FIG. 10. The yield of the target intermediate was 61%.

Into a 500-cm$^3$ flask, 2 g of the target intermediate and 200 cm$^3$ of acetic acid were charged. The mixture was heated at 130° C. for one hour and then cooled to 100° C. To the mixture, 30 cm$^3$ of a 48% aqueous solution of hydrogen bromide was added. After this mixture was heated for 30 minutes, water was added to this mixture, whereby a solid was obtained.

The solid was sufficiently washed with distilled water and methanol and then purified by silica gel chromatography and reprecipitation, whereby 0.9 g of dibromo-dibenzo[f,f']diindeno[1,2,3-cd:1',2',3'-lm]perylene was obtained as shown in FIG. 10. The yield of dibromo-dibenzo[f,f']diindeno[1,2,3-cd:1',2',3'-lm]perylene was 40%.

The luminescent dopant was synthesized in substantially the same manner as that for synthesizing the luminescent dopant of Example 6 except that dibromo-dibenzo[f,f']diindeno[1,2,3-cd:1',2',3'-lm]perylene was used. In this example, 0.5 g of the luminescent dopant was obtained as shown in FIG. 11. The molecular weight of the luminescent dopant was determined to be 2,998. The yield of the luminescent dopant was 32%.

Example 9

Figure 12:
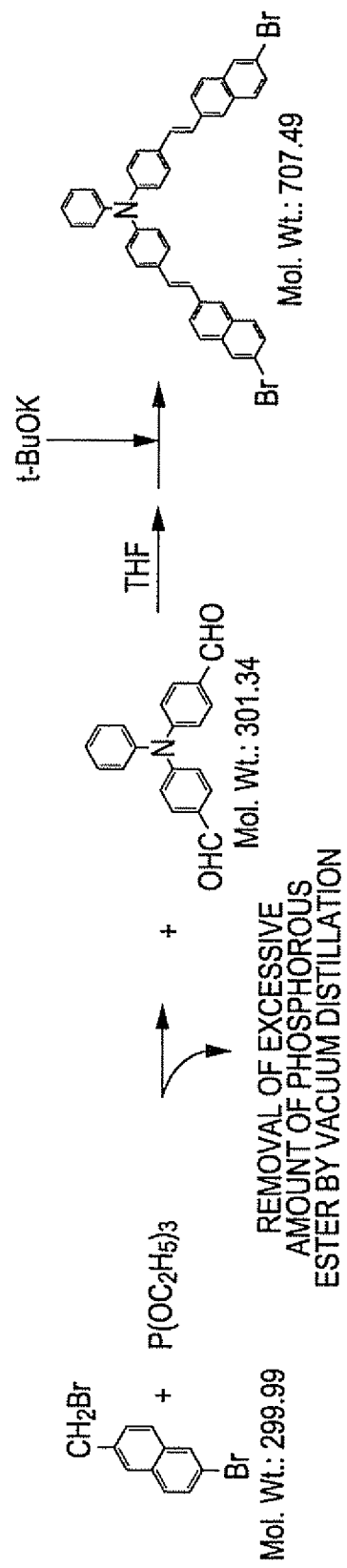
FIG. 12 is the first half of a flowchart showing a procedure for synthesizing a luminescent dopant having Formula XVII.
Figure 13:
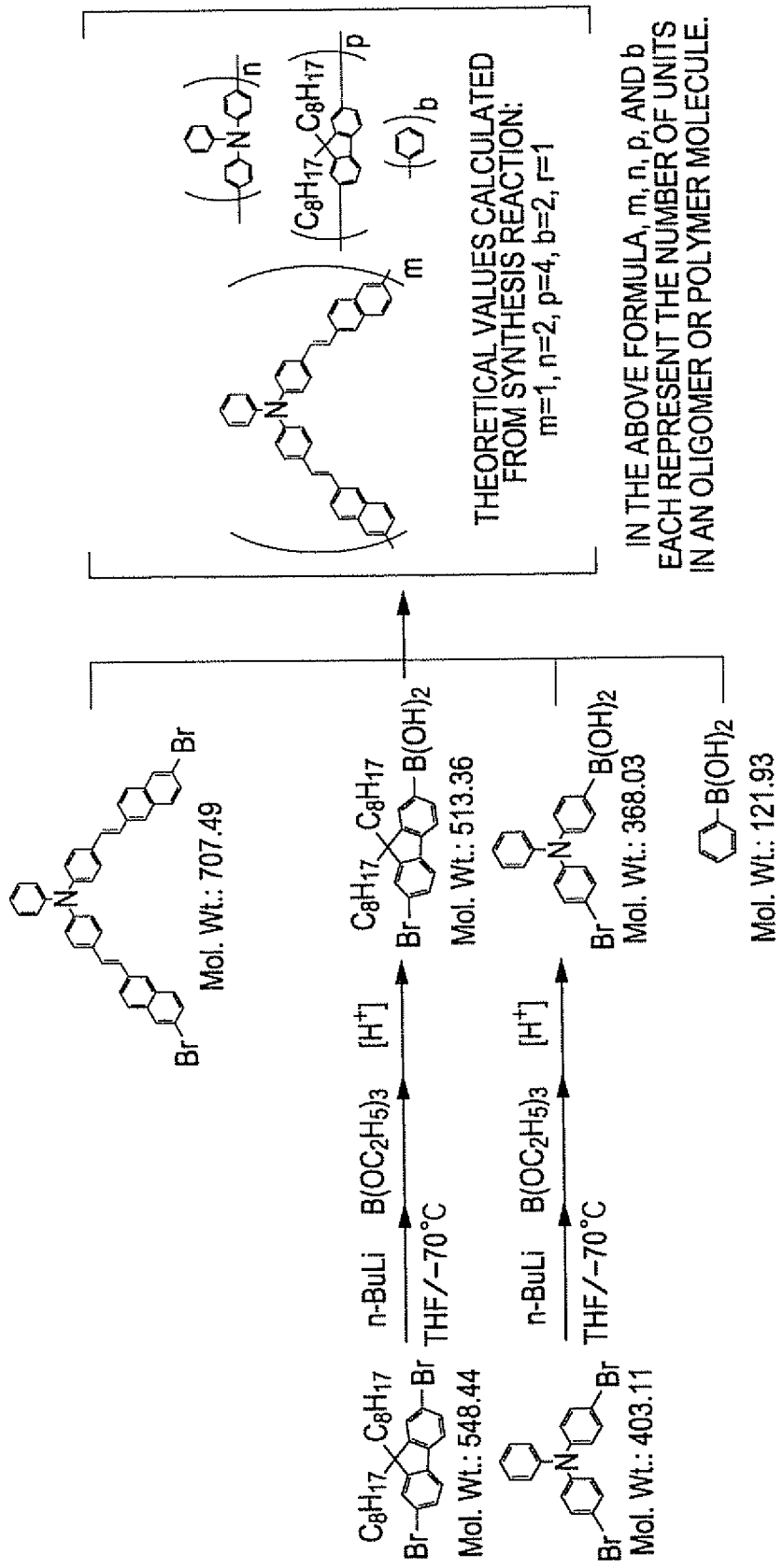
FIG. 13 is the second half of the flowchart showing the procedure for synthesizing the luminescent dopant having Formula XVII.

A luminescent dopant, used herein, having Formula XVII was synthesized by a procedure shown in FIGS. 12 and 13.

Into a 200-cm$^3$ Schlenk tube filled with argon, 2 g (6.7× 10$^{-3}$ mol) of 2-bromo-6-bromomethyl-naphthalene and 5 g of trimethyl phosphate were charged. The mixture was heated at 130° C. for three hours, cooled to room temperature, and then heated again. An excessive amount of trimethyl phosphate was removed from the mixture by vacuum distillation. After the Schlenk tube was filled with argon again, 1 g (3.3×10$^{-3}$ mol) of 4,4'-diformyltriphenylamine and 35 cm$^3$ of dry THF, which was used as a solvent, were charged into the Schlenk tube. The mixture in the Schlenk tube was heated at 80° C. for ten minutes. Into the Schlenk tube, 1.49 g (1.3×10$^{-2}$ mol) of t-butoxypotassium was charged. This mixture was subjected to reaction for ten hours and then cooled to room temperature. An adequate amount of distilled water and toluene were added to the reaction mixture. The mixture in the Schlenk tube was transferred to a 300-cm$^3$ separatory funnel. Toluene was poured into the separatory funnel. The mixture in the separatory funnel was washed with distilled water three times. The mixture in the separatory funnel was transferred to an evaporator. The solvents were removed from the mixture in the evaporator, whereby a yellow solid was obtained. The yellow solid was purified by silica gel chromatography using toluene and hexane and reprecipitation using dichloromethane and methanol, whereby 1.8 g of a target intermediate was obtained as shown in FIG. 12. The yield of the target intermediate was 76%.

The luminescent dopant was synthesized in substantially the same manner as that for synthesizing the luminescent dopant of Example 6 except that the above target intermediate was used. In this example, 0.6 g of the luminescent dopant was obtained as shown in FIG. 13. The molecular weight of the luminescent dopant was determined to be 2,743. The yield of the luminescent dopant was 31%.

Example 10

A luminescent dopant, used herein, having Formula XIX was synthesized by a procedure shown in FIGS. 12 and 13.

Figure 14:
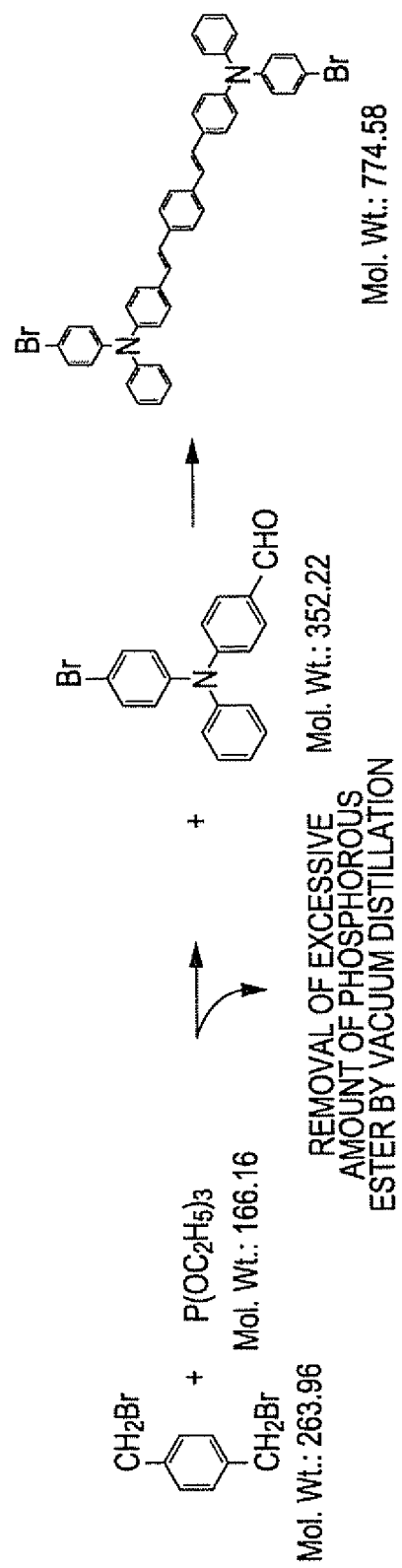
FIG. 14 is the first half of a flowchart showing a procedure for synthesizing a luminescent dopant having Formula XIX.

Into a 100-cm$^3$ Schlenk tube filled with argon, 1 g (3.8× 10$^{-3}$ mol) of 1,4-bis(bromomethyl)-naphthalene and 3 g of trimethyl phosphite were charged. The mixture was heated at 130° C. for three hours, cooled to room temperature, and then heated again. An excessive amount of trimethyl phosphite was removed from the mixture by vacuum distillation. After the Schlenk tube was filled with argon again, 0.67 g (1.9×10$^{-3}$ mol) of 4-bromo-4'-formyl-triphenylamine and 20 cm$^3$ of dry THF, which was used as a solvent, were charged into the Schlenk tube. The mixture in the Schlenk tube was heated at 80° C. for ten minutes. Into the Schlenk tube, 0.64 g (5.7×10$^{-2}$ mol) of t-butoxypotassium was charged. This mixture was subjected to reaction for ten hours and then cooled to room temperature. An adequate amount of distilled water and toluene were added to the reaction mixture. The mixture in the Schlenk tube was transferred to a 200-cm$^3$ separatory funnel. Toluene was poured into the separatory funnel. The mixture in the separatory funnel was washed with distilled water three times. The mixture in the separatory funnel was transferred to an evaporator. The solvents were removed from the mixture in the evaporator, whereby a yellow solid was obtained. The yellow solid was purified by silica gel chromatography using toluene and hexane and reprecipitation using dichloromethane and methanol, whereby 2.1 g of a target intermediate was obtained as shown in FIG. 14. The yield of the target intermediate was 72%.

Figure 15:
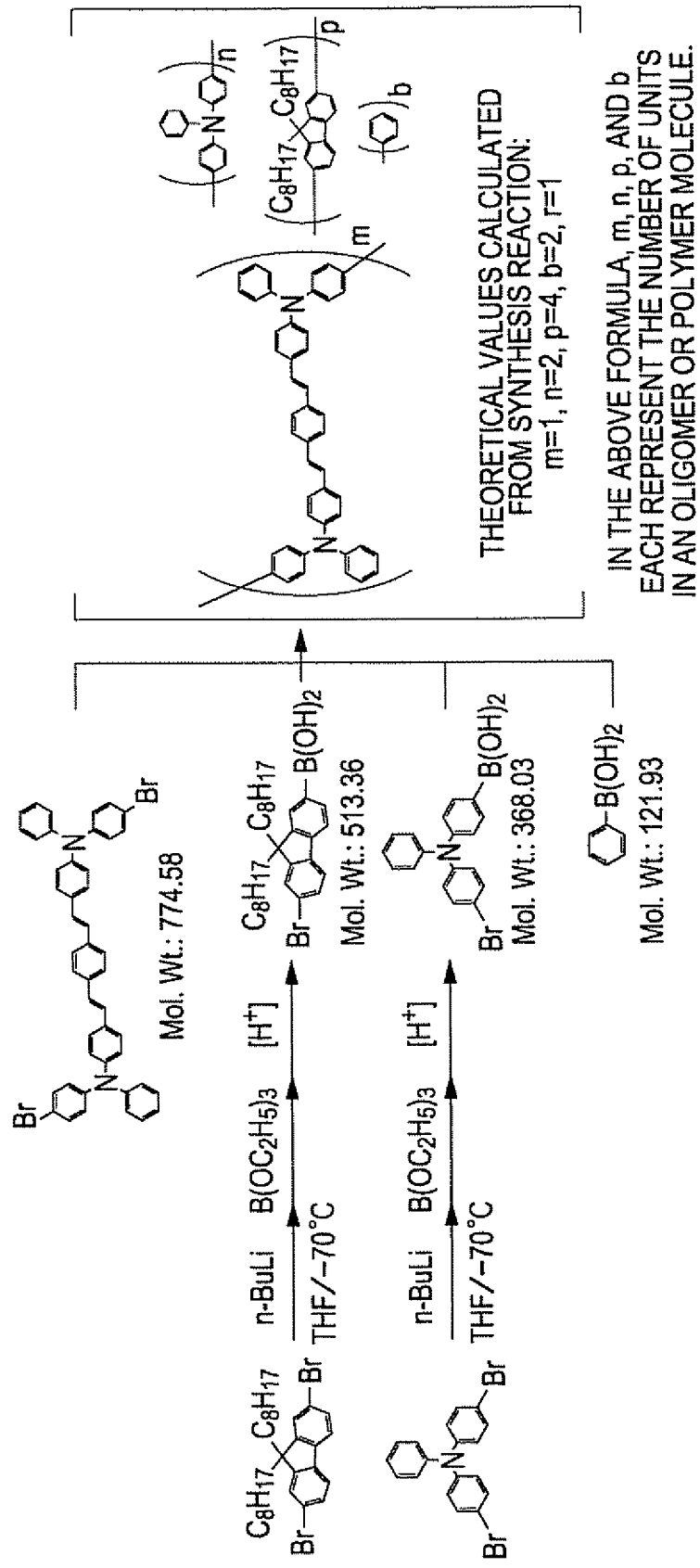
FIG. 15 is the second half of the flowchart showing the procedure for synthesizing the luminescent dopant having Formula XIX.

The luminescent dopant was synthesized in substantially the same manner as that for synthesizing the luminescent dopant of Example 6 except that the above target intermediate was used. In this example, 0.5 g of the luminescent dopant was obtained as shown in FIG. 15. The molecular weight of the luminescent dopant was determined to be 2,809. The yield of the luminescent dopant was 28%.

Example 11

The host material having Formula I, the luminescent dopant having Formula XII, and a hole transport material having the following formula were mixed at a ratio of 6.06:1.0:0.32 on a weight basis:

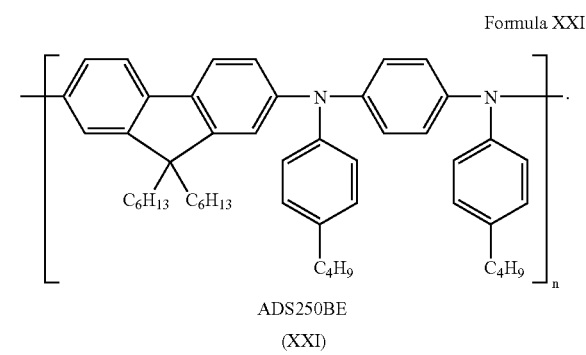

Formula XXI

ADS250BE (XXI)

The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 12

The host material having Formula II, the luminescent dopant having Formula XII and the hole transport material having Formula XXI were mixed at a ratio of 6.06:1.0:0.32 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 13

The host material having Formula I, the luminescent dopant having Formula XIV, and the hole transport material having Formula XXI were mixed at a ratio of 8.66:1.0:0.46 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 14

The host material having Formula II, the luminescent dopant having Formula XIV, and the hole transport material having Formula XXI were mixed at a ratio of 8.66:1.0:0.46 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 15

The host material having Formula I, the luminescent dopant having Formula XV, and the hole transport material having Formula XXI were mixed at a ratio of 11.79:1.0:0.62 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 16

The host material having Formula II, the luminescent dopant having Formula XV, and the hole transport material having Formula XXI were mixed at a ratio of 11.79:1.0:0.62 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 17

The host material having Formula II, the luminescent dopant having Formula XVII, and the hole transport material having Formula XXI were mixed at a ratio of 8.57:1.0:0.45 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spine coating process using the solution.

Example 18

The host material having Formula II, the luminescent dopant having Formula XIX, and the hole transport material having Formula XXI were mixed at a ratio of 9.47:1.0:0.50 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 19

The host material having Formula I, the luminescent dopant having Formula XII, and the hole transport material having Formula XXI were mixed at a ratio of 6.06:1.0:0.32 on a weight basis. The mixture was dissolved in chloroform, whereby a 1.5 weight percent chloroform solution (ink) of the mixture was prepared. The solution was used to manufacture an organic EL device having the same configuration as that described in the second embodiment. In particular, a light-emitting layer 104 included in the organic EL device was formed by a spin-coating process using the solution.

Example 20

The host material having Formula I, the luminescent dopant having Formula XIV, and the hole transport material having Formula XXI were mixed at a ratio of 8.66:1.0:0.46 on a weight basis. The mixture was dissolved in chloroform, whereby a 1.5 weight percent chloroform solution (ink) of the mixture was prepared. The solution was used to manufacture an organic EL device having the same configuration as that described in the second embodiment. In particular, a light-emitting layer 104 included in the organic EL device was formed by a spin-coating process using the solution.

Example 21

The host material having Formula I, the luminescent dopant having Formula XV, and the hole transport material having Formula XXI were mixed at a ratio of 11.79:1.0:0.62 on a weight basis. The mixture was dissolved in chloroform, whereby a 1.5 weight percent chloroform solution (ink) of the mixture was prepared. The solution was used to manufacture an organic EL device having the same configuration as that described in the second embodiment. In particular, a light-emitting layer 104 included in the organic EL device was formed by a spin-coating process using the solution.

Example 22

The host material having Formula II, the luminescent dopant having Formula XVII, and the hole transport material having Formula XXI were mixed at a ratio of 8.57:1.0:0.45 on a weight basis. The mixture was dissolved in chloroform, whereby a 1.5 weight percent chloroform solution (ink) of the mixture was prepared. The solution was used to manufacture an organic EL device having the same configuration as that described in the second embodiment. In particular, a light-emitting layer 104 included in the organic EL device was formed by a spin-coating process using the solution.

Example 23

The host material having Formula II, the luminescent dopant having Formula XIX, and the hole transport material having Formula XXI were mixed at a ratio of 9.47:1.0:0.50 on a weight basis. The mixture was dissolved in chloroform, whereby a 1.5 weight percent chloroform solution (ink) of the mixture was prepared. The solution was used to manufacture an organic EL device having the same configuration as that described in the second embodiment. In particular, a light-emitting layer 104 included in the organic EL device was formed by a spin-coating process using the solution.

Comparative Example 1

A host material having the following formula, the luminescent dopant having Formula IV, and the hole transport material having Formula XXI were mixed at a ratio of 46.55:1.0:2.45 on a weight basis:

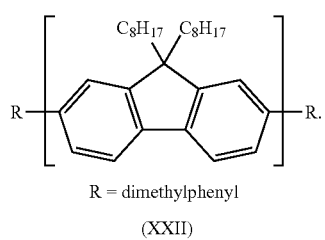

Formula XXII

R = dimethylphenyl (XXII)

The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Comparative Example 2

An organic EL device having the same configuration as that described in the first embodiment was manufactured in substantially the same manner as that described in Comparative Example 1 except that the luminescent dopant having the Formula VI instead of the luminescent dopant having Formula IV.

Comparative Example 3

An organic EL device having the same configuration as that described in the first embodiment was manufactured in substantially the same manner as that described in Comparative Example 1 except that the luminescent dopant having the Formula VII instead of the luminescent dopant having Formula IV.

Comparative Example 4

An organic EL device having the same configuration as that described in the first embodiment was manufactured in substantially the same manner as that described in Comparative Example 1 except that the luminescent dopant having the Formula IX instead of the luminescent dopant having Formula IV.

Comparative Example 5

An organic EL device having the same configuration as that described in the first embodiment was manufactured in substantially the same manner as that described in Comparative Example 1 except that the luminescent dopant having the Formula XI instead of the luminescent dopant having Formula IV.

Comparative Example 6

The host material having Formula XXII, the luminescent dopant having Formula XII, and the hole transport material having Formula XXI: were mixed at a ratio of 6.06:1.0:0.32 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 7

The host material having Formula XXII, the luminescent dopant having Formula XIV, and the hole transport material having Formula XXI were mixed at a ratio of 8.66:1.0:0.46 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 8

The host material having Formula XXII, the luminescent dopant having Formula XV, and the hole transport material having Formula XXI were mixed at a ratio of 11.79:1.0:0.62 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 9

The host material having Formula XXII, the luminescent dopant having Formula XVII, and the hole transport material having Formula XXI were mixed at a ratio of 8.57:1.0:0.45 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Example 10

The host material having Formula XXII, the luminescent dopant having Formula XIX, and the hole transport material having Formula XXI were mixed at a ratio of 9.47:1.0:0.50 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Comparative Example 11

The host material having Formula I, the luminescent dopant having Formula IV, and the hole transport material having Formula XXI were mixed at a ratio of 46.55:1.0:2.45 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Comparative Example 12

An organic EL device having the same configuration as that described in the first embodiment was manufactured in substantially the same manner as that described in Comparative Example 11 except that the luminescent dopant having the Formula VI instead of the luminescent dopant having Formula IV.

Comparative Example 13

An organic EL device having the same configuration as that described in the first embodiment was manufactured in substantially the same manner as that described in Comparative Example 11 except that the luminescent dopant having the Formula VII instead of the luminescent dopant having Formula IV.

Comparative Example 14

An organic EL device having the same configuration as that described in the first embodiment was manufactured in substantially the same manner as that described in Comparative Example 11 except that the luminescent dopant having the Formula IX instead of the luminescent dopant having Formula IV.

Comparative Example 15

An organic EL device having the same configuration as that described in the first embodiment was manufactured in substantially the same manner as that described in Comparative Example 11 except that the luminescent dopant having the Formula XI instead of the luminescent dopant having Formula IV.

Comparative Example 16

The host material having Formula II, the luminescent dopant having Formula IV, and the hole transport material having Formula XXI were mixed at a ratio of 46.55:1.0:2.45 on a weight basis. The mixture was dissolved in chloroform, whereby a 1.5 weight percent chloroform solution (ink) of the mixture was prepared. The solution was used to manufacture an organic EL device having the same configuration as that described in the first embodiment. In particular, a light-emitting layer 104 included in the organic EL device was formed by a spin-coating process using the solution.

Comparative Example 17

An organic EL device having the same configuration as that described in the first embodiment was manufactured in substantially the same manner as that described in Comparative Example 16 except that the luminescent dopant having the Formula VI instead of the luminescent dopant having Formula IV.

Comparative Example 18

An organic EL device having the same configuration as that described in the first embodiment was manufactured in substantially the same manner as that described in Comparative Example 16 except that the luminescent dopant having the Formula VII instead of the luminescent dopant having Formula IV.

Comparative Example 19

An organic EL device having the same configuration as that described in the first embodiment was manufactured in substantially the same manner as that described in Comparative Example 16 except that the luminescent dopant having the Formula IX instead of the luminescent dopant having Formula IV.

Comparative Example 20

An organic EL device having the same configuration as that described in the first embodiment was manufactured in substantially the same manner as that described in Comparative Example 16 except that the luminescent dopant having the Formula XI instead of the luminescent dopant having Formula IV.

Evaluation

The above organic EL devices were evaluated for chromaticity, brightness, and half-brightness lifetime in such a manner that voltages were applied to the organic EL devices such that the light-emitting layers had a current density of 50 mA/cm2, the half-brightness lifetime is defined as the time in which the bright of each organic EL device decays to half its original brightness. The evaluation results were summarized in Table 2. Materials for forming the light-emitting layers were summarized in Table 3.

TABLE 2

| | Configuration | Voltage (V) | Brightness (cd/m$^2$) | Half-brightness lifetime (h) | Chromaticity (—) | Luminescence |
|---|---|---|---|---|---|---|
| Example 1 | Configuration | 7.5 | 4,700 | 450 | 0.31, 0.65 | Good |
| Example 2 | described in the | 7.4 | 4,800 | 480 | 0.31, 0.65 | Good |
| Example 3 | first embodiment | 7.3 | 4,000 | 300 | 0.14, 0.27 | Good |

TABLE 2-continued

|  | Configuration | Voltage (V) | Brightness (cd/m$^2$) | Half-brightness lifetime (h) | Chromaticity (—) | Luminescence |
|---|---|---|---|---|---|---|
| Example 4 |  | 7.2 | 4,200 | 320 | 0.14, 0.27 | Good |
| Example 5 |  | 8.0 | 2,100 | 500 | 0.65, 0.35 | Good |
| Example 6 |  | 8.1 | 2,200 | 550 | 0.65, 0.35 | Good |
| Example 7 |  | 7.3 | 2,300 | 300 | 0.14, 0.10 | Good |
| Example 8 |  | 7.4 | 4,200 | 350 | 0.17, 0.21 | Good |
| Example 9 | configuration | 8.1 | 4,700 | 470 | 0.31, 0.65 | Good |
| Example 10 | described in | 7.8 | 3,900 | 350 | 0.14, 0.27 | Good |
| Example 11 | the second | 8.5 | 2,500 | 600 | 0.65, 0.35 | Good |
| Example 12 | embodiment | 8.2 | 2,400 | 330 | 0.14, 0.10 | Good |
| Example 13 |  | 8.1 | 4,300 | 400 | 0.17, 0.21 | Good |
| Comparative Example 1 | Configuration described in | 4.8 | 3,300 | 150 | 0.65, 0.35 | Uneven |
| Comparative Example 2 | the first embodiment | 5.0 | 3,000 | 90 | 0.14, 0.27 | Uneven |
| Comparative Example 3 |  | 5.3 | 1,500 | 200 | 0.65, 0.35 | Uneven |
| Comparative Example 4 |  | 5.2 | 2,000 | 80 | 0.14, 0.10 | Uneven |
| Comparative Example 5 |  | 5.0 | 3,900 | 110 | 0.17, 0.21 | Uneven |
| Comparative Example 6 | Configuration described in | 5.8 | 3,600 | 230 | 0.31, 0.65 | Uneven |
| Comparative Example 7 | the first embodiment | 5.0 | 3,300 | 110 | 0.14, 0.27 | Uneven |
| Comparative Example 8 |  | 5.2 | 1,800 | 250 | 0.65, 0.35 | Uneven |
| Comparative Example 9 |  | 5.2 | 1,800 | 100 | 0.14, 0.10 | Uneven |
| Comparative Example 10 |  | 5.1 | 3,500 | 120 | 0.17, 0.21 | Uneven |
| Comparative Example 11 | Configuration described in | 7.1 | 4,000 | 70 | 0.65, 0.35 | Uneven |
| Comparative Example 12 | the first embodiment | 7.3 | 3,500 | 70 | 0.14, 0.26 | Uneven |
| Comparative Example 13 |  | 7.0 | 1,500 | 100 | 0.65, 0.35 | Uneven |
| Comparative Example 14 |  | 7.2 | 1,400 | 60 | 0.14, 0.10 | Uneven |
| Comparative Example 15 |  | 7.2 | 3,300 | 80 | 0.17, 0.21 | Uneven |
| Comparative Example 16 | Configuration described in | 7.2 | 4,000 | 80 | 0.65, 0.35 | Uneven |
| Comparative Example 17 | the first embodiment | 7.2 | 3,400 | 70 | 0.14, 0.26 | Uneven |
| Comparative Example 18 |  | 7.3 | 1,650 | 120 | 0.65, 0.35 | Uneven |
| Comparative Example 19 |  | 7.1 | 1,500 | 70 | 0.14, 0.10 | Uneven |
| Comparative Example 20 |  | 7.3 | 3,200 | 90 | 0.17, 0.21 | Uneven |

TABLE 3

|  | Materials for forming light-emitting layers | | | Ratios of materials used | | |
|---|---|---|---|---|---|---|
|  | Host materials | Luminescent dopants | Hole transport materials | Host materials | Luminescent dopants | Hole transport materials |
| Example 1 | Formula I | Formula XII | Formula XXI | 6.06 | 1 | 0.32 |
| Example 2 | Formula II | Formula XII | Formula XXI | 6.06 | 1 | 0.32 |
| Example 3 | Formula I | Formula XIV | Formula XXI | 8.66 | 1 | 0.46 |
| Example 4 | Formula II | Formula XIV | Formula XXI | 8.66 | 1 | 0.46 |
| Example 5 | Formula I | Formula XV | Formula XXI | 11.79 | 1 | 0.62 |
| Example 6 | Formula II | Formula XV | Formula XXI | 11.79 | 1 | 0.62 |
| Example 7 | Formula II | Formula XVII | Formula XXI | 8.57 | 1 | 0.45 |
| Example 8 | Formula II | Formula XIX | Formula XXI | 9.47 | 1 | 0.5 |
| Example 9 | Formula I | Formula XII | Formula XXI | 6.06 | 1 | 0.32 |
| Example 10 | Formula I | Formula XIV | Formula XXI | 8.66 | 1 | 0.46 |
| Example 11 | Formula I | Formula XV | Formula XXI | 11.79 | 1 | 0.62 |
| Example 12 | Formula II | Formula XVII | Formula XXI | 8.57 | 1 | 0.45 |
| Example 13 | Formula II | Formula XIX | Formula XXI | 9.47 | 1 | 0.5 |
| Comparative Example 1 | Formula XXII | Formula IV | Formula XXI | 46.55 | 1 | 2.45 |

TABLE 3-continued

| | Materials for forming light-emitting layers | | | Ratios of materials used | | |
|---|---|---|---|---|---|---|
| | Host materials | Luminescent dopants | Hole transport materials | Host materials | Luminescent dopants | Hole transport materials |
| Comparative Example 2 | Formula XXII | Formula VI | Formula XXI | | | |
| Comparative Example 3 | Formula XXII | Formula VII | Formula XXI | | | |
| Comparative Example 4 | Formula XXII | Formula IX | Formula XXI | | | |
| Comparative Example 5 | Formula XXII | Formula XI | Formula XXI | | | |
| Comparative Example 6 | Formula XXII | Formula XII | Formula XXI | 6.06 | 1 | 0.32 |
| Comparative Example 7 | Formula XXII | Formula XIV | Formula XXI | 8.66 | 1 | 0.46 |
| Comparative Example 8 | Formula XXII | Formula XV | Formula XXI | 11.79 | 1 | 0.62 |
| Comparative Example 9 | Formula XXII | Formula XVII | Formula XXI | 8.57 | 1 | 0.45 |
| Comparative Example 10 | Formula XXII | Formula XIX | Formula XXI | 9.47 | 1 | 0.5 |
| Comparative Example 11 | Formula I | Formula IV | Formula XXI | 46.55 | 1 | 2.45 |
| Comparative Example 12 | Formula I | Formula VI | Formula XXI | | | |
| Comparative Example 13 | Formula I | Formula VII | Formula XXI | | | |
| Comparative Example 14 | Formula I | Formula IX | Formula XXI | | | |
| Comparative Example 15 | Formula I | Formula XI | Formula XXI | | | |
| Comparative Example 16 | Formula II | Formula IV | Formula XXI | 46.55 | 1 | 2.45 |
| Comparative Example 17 | Formula II | Formula VI | Formula XXI | | | |
| Comparative Example 18 | Formula II | Formula VII | Formula XXI | | | |
| Comparative Example 19 | Formula II | Formula IX | Formula XXI | | | |
| Comparative Example 20 | Formula II | Formula XI | Formula XXI | | | |

The organic EL device of Example 1 had a half-brightness lifetime of 450 hours. The organic EL device of Example 2 had a half-brightness lifetime of 480 hours. The organic EL device of Example 3 had a half-brightness lifetime of 300 hours. The organic EL device of Example 4 had a half-brightness lifetime of 320 hours. The organic EL device of Example 5 had a half-brightness lifetime of 500 hours. The organic EL device of Example 6 had a half-brightness lifetime of 550 hours. The organic EL device of Example 7 had a half-brightness lifetime of 300 hours. The organic EL device of Example 8 had a half-brightness lifetime of 350 hours. The organic EL device of Example 9 had a half-brightness lifetime of 470 hours. The organic EL device of Example 10 had a half-brightness lifetime of 350 hours. The organic EL device of Example 11 had a half-brightness lifetime of 600 hours. The organic EL device of Example 12 had a half-brightness lifetime of 330 hours. The organic EL device of Example 13 had a half-brightness lifetime of 400 hours. The organic EL device of Comparative Example 1 had a half-brightness lifetime of 150 hours. The organic EL device of Comparative Example 2 had a half-brightness lifetime of 90 hours. The organic EL device of Comparative Example 3 had a half-brightness lifetime of 200 hours. The organic EL device of Comparative Example 4 had a half-brightness lifetime of 80 hours. The organic EL device of Comparative Example 5 had a half-brightness lifetime of 110 hours. The organic EL device of Comparative Example 6 had a half-brightness lifetime of 230 hours. The organic EL device of Comparative Example 7 had a half-brightness lifetime of 110 hours. The organic EL device of Comparative Example 8 had a half-brightness lifetime of 250 hours. The organic EL device of Comparative Example 9 had a half-brightness lifetime of 100 hours. The organic EL device of Comparative Example 10 had a half-brightness lifetime of 120 hours. The organic EL device of Comparative Example 11 had a half-brightness lifetime of 70 hours. The organic EL device of Comparative Example 12 had a half-brightness lifetime of 70 hours. The organic EL device of Comparative Example 13 had a half-brightness lifetime of 100 hours. The organic EL device of Comparative Example 14 had a half-brightness lifetime of 60 hours. The organic EL device of Comparative Example 15 had a half-brightness lifetime of 80 hours. The organic EL device of Comparative Example 16 had a half-brightness lifetime of 80 hours. The organic EL device of Comparative Example 17 had a half-brightness lifetime of 70 hours. The organic EL device of Comparative Example 18 had a half-brightness lifetime of 120 hours. The organic EL device of Comparative Example 19 had a half-brightness lifetime of 70 hours. The organic EL device of Comparative Example 20 had a half-brightness lifetime of 90 hours.

As described above, the organic EL devices of Examples 1 to 13 had a half-brightness lifetime longer than that of the organic EL devices of Comparative Examples 1 to 20. This means that the organic EL devices of Examples 1 to 13 have high reliability.

What is claimed is:

1. An organic electroluminescent device comprising:
a light-emitting layer containing at least one host material and at least one luminescent dopant serving as a guest, the luminescent dopant having a luminescent center that is a derivative of:

Formula VI

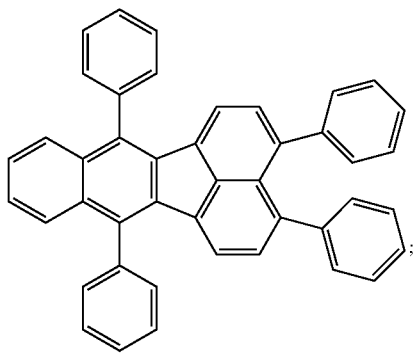

(VI)

Formula VII

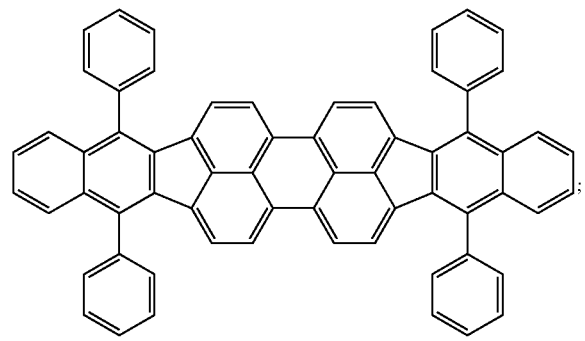

(VII)

Formula IX

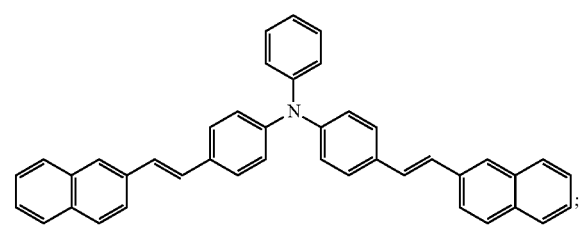

(IX)

Formula X

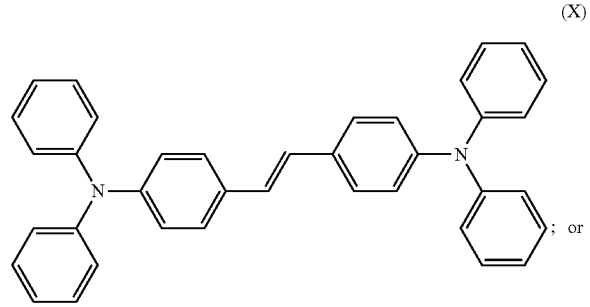

(X)

; or

Formula XI

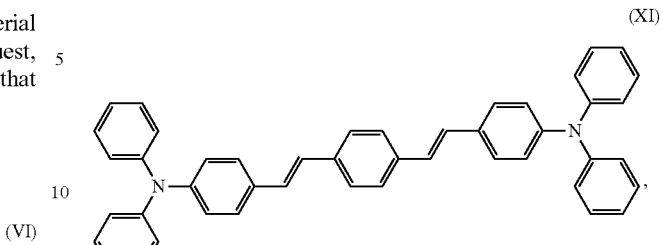

(XI)

, wherein the host material is a polymer having repeating units linked to each other by a non-conjugated system and the luminescent dopant is a Π-conjugated oligomer.

2. The organic electroluminescent device according to claim 1, wherein the repeating units each have at least one anthracenyl group, diphenylanthracenyl group, and/or fluorene derivative group.

3. The organic electroluminescent device according to claim 1, wherein the luminescent dopant has a fluorene unit and a triarylamine unit.

4. The organic electroluminescent device according to claim 1, wherein the light-emitting layer further contains a hole transport material.

5. The organic electroluminescent device according to claim 4, wherein the luminescent dopant, the host material, and the hole transport material are contained in the light-emitting layer such that the following equation is satisfied:

$$k=(a/(b+c))\times 100$$

wherein k ranges from 0.5 to 10.0 weight percent, a represents the weight of the luminescent center, b represents the weight of the luminescent dopant, c represents the weight of the host material, and the sum of b and c is equal to the sum of the weight of the luminescent dopant, the weight of the host material, and the weight of a third component when the third component is contained in the light-emitting layer.

6. The organic electroluminescent device according to claim 1, further comprising a hole injection layer and/or a hole transport layer.

7. The organic electroluminescent device according to claim 1, further comprising a layer formed on the light-emitting layer by a vapor deposition process.

8. The organic electroluminescent device according to claim 1, wherein the light-emitting layer is formed by a spin-coating process or an ink jet process.

9. The organic electroluminescent device according to claim 1, wherein a weight ratio of the host material to the luminescent dopant is from 100:0.5 to 100:10.

10. The organic electroluminescent device according to claim 1, wherein the luminescent dopant further comprises a triphenylamine unit, a fluorene unit, and a phenyl group in addition to the luminescent center.

11. An organic electroluminescent device comprising:
a light-emitting layer containing at least one host material and at least one luminescent dopant consisting of:

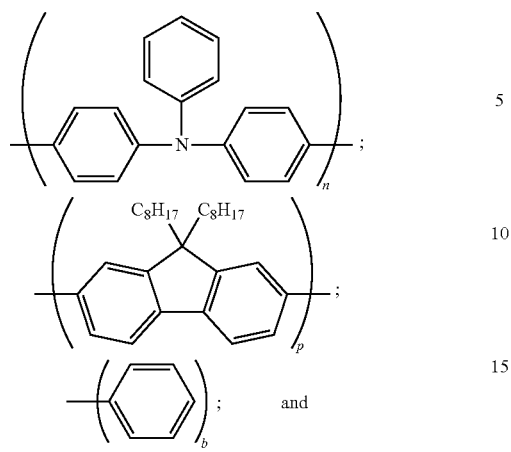
(5)
(10)
(15)
and
one member selected from the group consisting of:
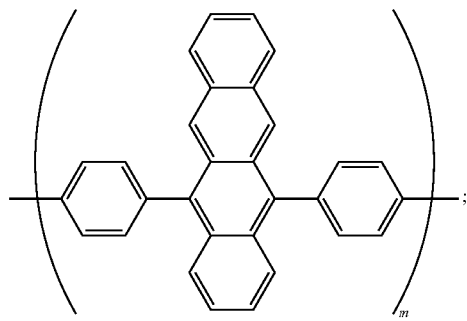
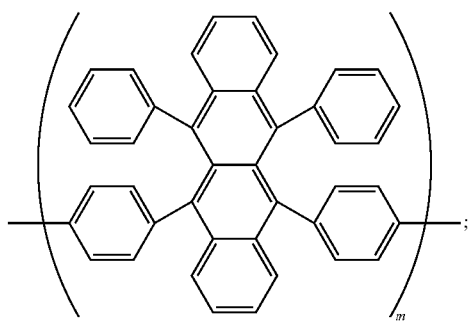
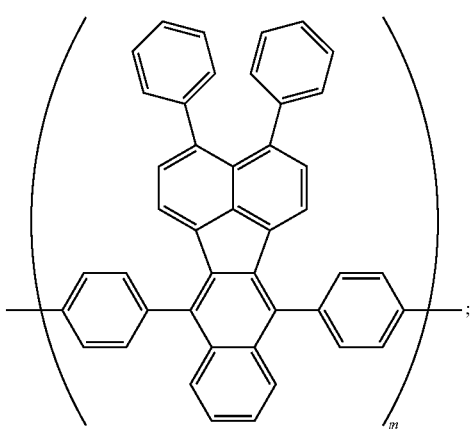

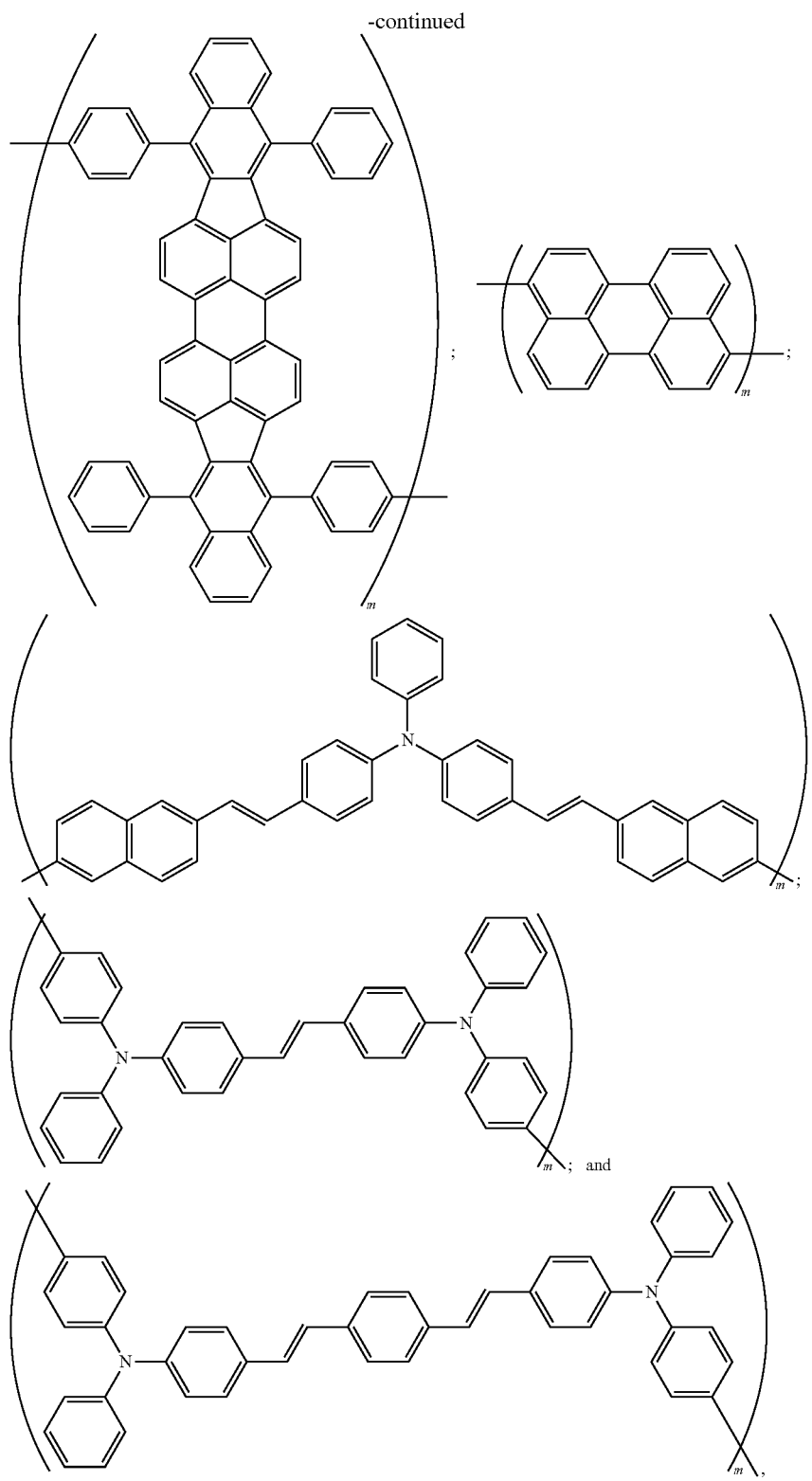

wherein:
the luminescent dopant is an oligomer or polymer having a molecular weight from about 2,000 to 20.000;
n, p, b, and m represent the number of units in the oligomer or polymer; and the host material is a polymer having repeating units linked to each other by a non-conjugated system.

12. The organic electroluminescent device according to claim 11, wherein n is 2, p is 4, b is 2, and m is 1.

13. The organic electroluminescent device according to claim 1, wherein the luminescent dopant further comprises a triphenylamine unit, a fluorene unit, and a phenyl end group in addition to the luminescent center.

* * * * *